United States Patent
Kariya et al.

(10) Patent No.: US 6,344,608 B2
(45) Date of Patent: *Feb. 5, 2002

(54) PHOTOVOLTAIC ELEMENT

(75) Inventors: Toshimitsu Kariya; Masafumi Sano, both of Kyoto; Yutaka Nishio, Kyotanabe, all of (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/340,464

(22) Filed: Jun. 28, 1999

(30) Foreign Application Priority Data

Jun. 30, 1998 (JP) .......................................... 10-183884

(51) Int. Cl.[7] .................. H01L 31/0216; H01L 31/0232
(52) U.S. Cl. ....................................... 136/257; 136/256
(58) Field of Search ................................. 136/252, 255, 136/256, 257; 257/432, 436, 449

(56) References Cited

U.S. PATENT DOCUMENTS

| | | | | |
|---|---|---|---|---|
| 3,679,949 A | * | 7/1972 | Uekusa et al. | 317/238 |
| 4,121,238 A | * | 10/1978 | Bachmann et al. | 357/16 |
| 4,167,015 A | * | 9/1979 | Hanak | 357/16 |
| 4,316,049 A | * | 2/1982 | Hanak | 136/244 |
| 4,726,849 A | * | 2/1988 | Murata et al. | 136/244 |
| 4,808,242 A | * | 2/1989 | Murata et al. | 136/244 |
| 5,032,527 A | * | 7/1991 | Maeba et al. | 437/2 |

FOREIGN PATENT DOCUMENTS

| | | | | |
|---|---|---|---|---|
| JP | 6-5893 | 1/1994 | | |
| JP | 7-84651 | 9/1995 | | |
| JP | 7-111482 | 11/1995 | | |
| JP | 8-43840 | 2/1996 | | |
| JP | 8-56004 | 2/1996 | | |
| JP | 8043840 A | * | 2/1996 | ......... G02F/1/1343 |
| JP | 8-77845 | 3/1996 | | |
| JP | 9-78236 | 3/1997 | | |

OTHER PUBLICATIONS

D. Fischer et al., "The 'Micromorph' Solar Cell: Extending a–Si:H Technology Towards Thin Film Crystalline Silicone", IEEE, 25th PVSC, pp. 1053–1056 (1996).

* cited by examiner

Primary Examiner—Rena L. Dye
Assistant Examiner—Mike Missiur
(74) Attorney, Agent, or Firm—Fitzpatrick, Cella, Harper & Scinto

(57) ABSTRACT

A photovoltaic element comprising a p-type semiconductor layer and a transparent conductive layer comprised of indium tin oxide bonded to each other at a surface is provided. The sum of tin oxide content and tin content of the transparent conductive layer varies in the layer thickness direction and is lowest at the bonding surface of the p-type semiconductor layer and the transparent conductive layer. Thus provided is a photovoltaic element which has a high photoelectric conversion efficiency with decreased reduction even when exposed to an intense light for a long period.

13 Claims, 7 Drawing Sheets

$|Eh2| = \chi 2 - \phi 2$

- P-TYPE SEMICONDUCTOR LAYER
- TRANSPARENT CONDUCTIVE LAYER
- COLLECTING ELECTRODE

PHOTOVOLTAIC ELEMENT

BACKGROUND OF THE INVENTION

Field of the Invention

The present invention relates to a transparent conductive layer on the light incident side of a solar cell, a photosensor, or other photovoltaic element. The present invention relates, in particular, to those technologies which enhance the photoelectric conversion efficiency of photovoltaic elements and those technologies which increase long-term stability by inhibiting light degradation and heat degradation. The present invention relates also to improvements of cost-efficiency of photovoltaic elements.

Recently, many houses have been equipped with solar cells on their roof which are connected to the general power system so as to meet power requirements as much as possible. However, the power generation cost with solar cells is still high, which prohibits large-scale pervasion.

Although the employment of amorphous silicon-based thin-films as photovoltaic layers is said to be effective in improvement of the cost efficiency of solar cells, those thin-films have a low photoelectric conversion efficiency (conversion efficiency) as compared to crystalline solar cells and also suffer from decreases in the conversion efficiency when exposed to light irradiation, i.e., light degradation. With this, most of the past research so far pronounced on solar cells employing amorphous silicon-based thin-films, i.e., amorphous solar cells, has been concerned about two respects, i.e., "how to increase the conversion efficiency" and "how to decrease the light degradation".

So far, reportedly, transparent conductive layers could have been improved to obtain high-efficiency photovoltaic elements, i.e., solar cells. For example, according to Japanese Patent Application Laid-Open No. 8-77845, indium tin oxide (ITO) is formed and then exposed to a corpuscular beam of an inert gas to promote its own crystallization, thus obtaining low-resistivity, high-transmittance ITO thin-films. Also, according to another Japanese Patent Publication No. 7-84651, the crystallinity of ITO is controlled such that the <111> axis orientates perpendicularly to the substrate surface, thus making a trigonometric cone of the ITO surface in geometry to decrease reflection loss and improve short-circuit current and also to improve the conversion efficiency. Also, according to another Japanese Patent Application Laid-Open No. 9-78236, ITO thin-films are formed with xenon gas instead of argon gas to enhance a carrier density, thereby obtaining low-resistance ITO thin-films at a relatively low substrate temperature.

Besides, an attempt has been made to form transparent thin-films into a stacked structure. For example, according to another Japanese Patent Publication No. 7-111482, transparent thin-films having different refractive indexes are stacked to obtain better reflection-preventing thin-films in a visible ray region of 450 to 650 nm. Those thin-films, however, are formed into a stacked structure comprising non-conductive thin-films.

According to another Japanese Patent Application Laid-Open No. 8-43840, a plurality of high-carrier-density thin-films (ITO:$SnO_2$, 10% by weight (wt %)) and high-carrier-mobility thin-films (ITO:$SnO_2$, 0.3 wt %) are stacked and annealed to obtain transparent conductive layers for LCD having a sheet resistivity of 5.4 $\Omega/\square$.

Recently, on the other hand, such solar cells comprising single cells using μc-Si:H thin-films as the i-type layer are reported that have a high conversion efficiency and no light degradation. This solar cell is attracting world attention as an alternative to such a type of a solar cell that employs an a-SiGe:H thin-film as the i-type layer. The μc-Si:H thin-film eliminates light degradation inherent to amorphous silicon-based thin-films such as a-SiGe:H thin-films and, moreover, need not use costly material gases such as German gas ($GeH_4$). In addition, this μc-Si:H thin-film does not have a high absorption coefficient as compared to a-SiGe:H thin-films, but has a possibility to gain a short-circuit current (Jsc) almost like a-SiGe:H single cells by providing 2 μm or larger thin-film thickness of the i-type layer. One example of reports to that effect is J. Meier, et al., "On the Way Towards High Efficiency Thin-Film Silicon Solar Cells by the Micromorph Concept", MRS Symposium Proceeding, vol. 420, Amorphous Silicon Technology, pp. 3–13, 1996, where solar cells are reported that have the i-type layer comprised of microcrystalline silicon. This solar cell is made by VHF plasma enhanced CVD using a frequency of 110 MHz, achieving a conversion efficiency of 7.7% for single cells having one pin junction. This single cell has a great advantage of having no light degradation. Also, by further stacking thereon another pin junction containing amorphous silicon-based thin-film as an i-type layer to make a stacked cell, a conversion efficiency of 13.1% is attained. However, its light degradation rate is still high, almost the same as that for conventional amorphous silicon-based solar cells.

The inventors have made sure of such a time-wise phenomenon that indium tin oxide (ITO) thin-films have a higher resistivity with a rising temperature in the air. The inventors have also found that as light irradiation continues, a photovoltaic element using such ITO thin-films as transparent conductive layers has a higher temperature itself and a higher resistivity of the transparent conductive layer and also a lower fill factor, short-circuit light current, and conversion efficiency. For example, in an embodiment of Japanese Patent Application Laid-Open No. 8-56004, the vacuum evaporation method by use of electron beam is used to form transparent conductive layers comprised of ITO on a substrate. Also, in an embodiment of Japanese Patent Application Laid-Open No. 7-297428, the evaporation method is used to form transparent conductive layers comprised of ITO on a photovoltaic layer. Those photovoltaic elements having ITO thin-films formed by the vacuum evaporation method have a high initial conversion efficiency but, when exposed to intense light irradiation (e.g., 100 mW/cm$^2$), has a higher resistivity of the ITO thin-films and a lower conversion efficiency as time passes. Also, according to Japanese Patent Application Laid-Open No. 8-43840, a plurality of high-carrier-concentration thin-films (ITO:$SnO_2$, 10 wt %) and high-carrier-mobility thin-films (ITO:$SnO_2$, 0.3 wt %) are stacked and then annealed, thereby obtaining low-resistivity transparent conductive layers for liquid crystal displays. However, when the above-mentioned thin-films are stacked on a photovoltaic layer and annealed, dopants such as phosphorus or boron are mutually diffused, thereby posing a problem of lowering open circuit voltage. Moreover, the light transmittancy (short-circuit current) was not high enough as required for photovoltaic elements.

In an example of Japanese Patent Application Laid-Open No. 6-5893, ITO is formed on a photovoltaic layer (pin layer) by the sputtering method. However, it suffers from a respect that the short-circuit current Jsc is small for single cells employing an a-SiGe:H thin-film as the i-type layer. As against this, research by the inventors has shown that a certain type of ITO thin-film formed by the sputtering method has a very high thermal stability, having a change rate of resistivity of approximately 1.1 even over a time lapse of 3000 hours at a temperature of 120° C. The research by the inventors has shown also that a photovoltaic element having ITO thin-films formed on its photovoltaic layer by the sputtering method suffers from a respect that its short-circuit current is smaller than that of a photovoltaic element having ITO thin-films formed on its photovoltaic layer by the vacuum evaporation method. In addition, it has another problem that by the sputtering method, plasma comes in a high energy state to damage photovoltaic elements, thereby increasing the leakage current and decreasing the open circuit voltage. In an even worse case, it suffers from a respect that photovoltaic elements may be short-circuited. However, the photovoltaic element having ITO thin-films formed by the sputtering method has also advantages such as a high fill factor and a very excellent heat resistance.

SUMMARY OF THE INVENTION

One object of the present invention is to provide a photovoltaic element that has a high conversion efficiency which does not decrease so much even when exposed to intense light for a long time. Another object of the present invention is to eliminate the decrease in the conversion efficiency due to a rise in the temperature of a photovoltaic element caused by the irradiation of intense light.

Another object of the present invention is to improve the thermal stability of the conversion efficiency of photovoltaic elements having ITO thin-films formed on their photovoltaic layers.

As a means to solve the above-mentioned problems, the present invention provides a photovoltaic element having a p-type semiconductor layer and a transparent conductive layer comprised of indium tin oxide (ITO) junctioned face-to-face, wherein the transparent conductive layer comprises a plurality of layers and a sum of the content of tin oxide of the layer and that of tin which is the closest to the junction surface between the above-mentioned p-type semiconductor layer and transparent conductive layer of the plurality of layers is smaller than the sum of that for the other layers.

Indium tin oxide (ITO) contains mainly indium atoms, tin atoms, and oxygen atoms. Those indium atoms and tin atoms exist respectively in the state of indium oxide or another state such as an indium simple substance and the state of tin oxide or another state of a tin simple substance. The "sum of the content of tin oxide and that of tin" as referred to in the present invention means, in terms of oxide, a sum of the mole concentration of tin oxide and that of tin present in the state of tin oxide such as a tin simple substance. In other words, the "sum of the tin oxide content and the tin content" means the value of a content of tin oxide calculated from an amount of tin atoms on the assumption that all of the tin exists in the state of tin oxide and all of the indium exists in indium oxide.

Such a value can be obtained by, for example, determining the concentration of tin atoms by the inductive coupling plasma emission (ICP) method, etc. and converting it in terms as oxide. If in this case the amount of tin present in a state other than tin oxide in the ITO is negligible, the "sum of tin oxide content and tin content" may be taken to be "tin oxide content".

In this case, it is preferable that the sum of the content of tin oxide and that of tin of a layer which is the closest to the above-mentioned junction surface be 10 mole % or less.

It is also preferable that the sum of tin oxide content and tin content for such a layer that has the largest sum of contents of tin oxide and tin of the above-mentioned plurality of layers be between 12 mole % and 30 mole %, both inclusive.

It is also preferable that the thickness of the layer closest to the above-mentioned junction surface be a half or less of the thickness of the entire transparent conductive layer.

It is also preferable that the thickness of the layer that has the largest sum of tin oxide content and tin content of the above-mentioned plurality of layers be a half or more of the thickness of the entire transparent conductive layer.

As another means to solve the above-mentioned problems, the present invention provides a photovoltaic element having a p-type semiconductor layer and a transparent conductive layer comprised of indium tin oxide (ITO) junctioned face-to-face, wherein the sum of the content of tin oxide and that of tin within the transparent conductive layer continuously changes in the film-thickness direction, coming in a minimum at the junction surface between the above-mentioned p-type semiconductor layer and transparent conductive layer.

In this case, it is preferable that the sum of a tin oxide content and a tin content within the transparent conductive layer on the above-mentioned junction surface be 10 mole % or less.

It is also preferable that the sum of a tin oxide content and a tin content of the region that has the largest above-mentioned sum of the above-mentioned plurality of layers be between 12 mole % and 30 mole %, both inclusive.

It is also preferable that the region whose sum of a tin oxide content and tin content in the above-mentioned transparent conductive layer is 10 mole % or less occupy a half or less of the entire transparent conductive layer.

It is also preferable that the region whose sum of tin oxide content and tin content in the above-mentioned transparent conductive layer is 12 mole % or larger occupy a half or more of the entire transparent conductive layer.

As another means to solve the above-mentioned problems, the present invention provides a photovoltaic element in a thermal equilibrium state having a p-type semiconductor layer and a transparent conductive layer comprised of indium tin oxide (ITO) junctioned face-to-face, wherein the lower end of the conduction band of the transparent conductive layer changes in the layer-thickness direction and also the difference between the level of the lower end of the conduction band of the transparent conductive layer in the vicinity of the junction surface between the p-type semiconductor layer and the transparent conductive layer and the Fermi level is larger than an average difference over the entire area of the transparent conductive layer.

DESCRIPTION OF THE PREFERRED EMBODIMENTS

To improve the conversion efficiency of photovoltaic elements, it is critical to decrease the specific resistance and increase the transmittance of the transparent conductive layer. However, the inventors have found as a result of research "when the transparent conductive layer and the photovoltaic layer have reached a relatively high level in quality, improvements in the characteristics of the simple substances of the transparent conductive layer such as specific resistance and transmittance do not necessarily lead to improvement in the characteristics of the photovoltaic element". The inventors have concluded that when a semiconductor layer in contact with the transparent conductive layer is, in particular, of a p-type, its junction state is very important. The inventors have also found that when the transparent conductive layer comprised of ITO in junction with semiconductor layers is exposed to high temperatures such as 60° C., the specific resistance may sometimes rise as time passes. The extent of a rise in temperature is found to be correlated with the sum of a tin oxide content and a tin content of the transparent conductive layer comprised of ITO, in such manner that with smaller contents of about 5 mole %, the specific resistance rises as time passes and with larger contents of about 15 mole %, the specific resistance comes to have an excellent thermal stability. It has been found, however, that if a highly-heat-stable transparent conductive layer having a large sum (which may sometimes be abbreviated simply as tin concentration hereinafter) of a tin oxide content and tin content is junctioned as it is with a photovoltaic layer, the conversion efficiency degrades little. Discussion on the conditions for forming the transparent conductive layer has concluded that the conversion efficiency in this case extremely rarely becomes higher than that with the case of junction with a transparent conductive layer having a lower tin concentration.

The present invention has been based on those experimental results, resulting in a photovoltaic element having an improved junction between transparent conductive layers and photovoltaic layers, as well as a high conversion efficiency and a good thermal stability.

Figure 3:
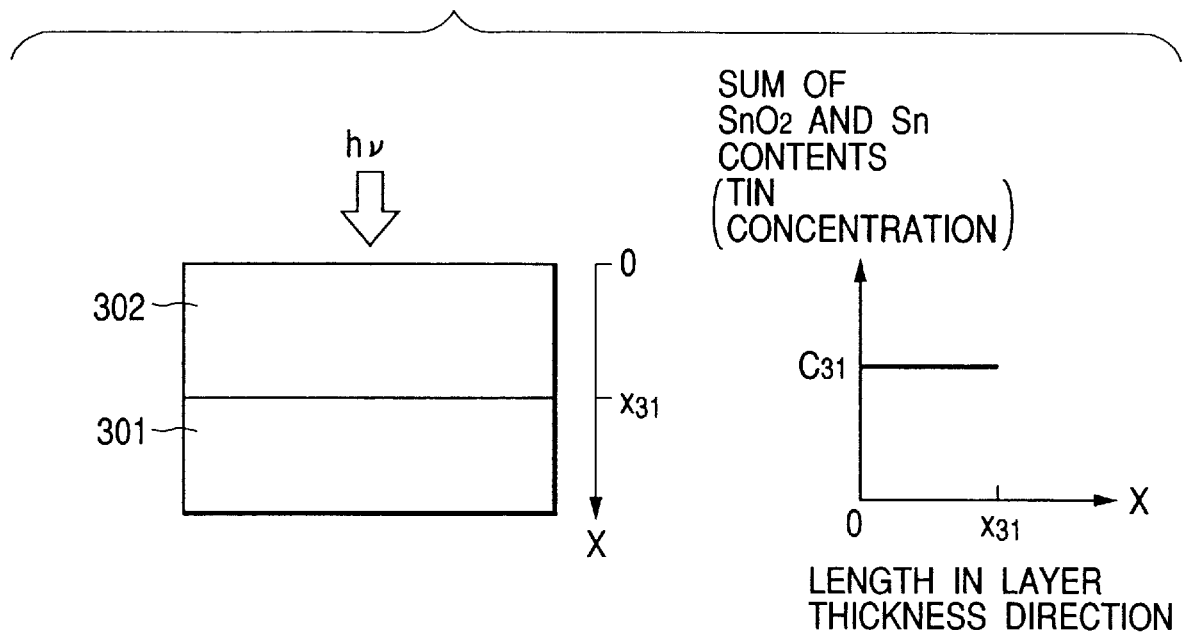
FIG. 3 shows a schematic partial cross-sectional view of a configuration of a conventional photovoltaic element and a layer-thickness directional distribution of a sum of tin oxide content and tin content.

FIG. 3 is a partial cross-sectional view of a conventional photovoltaic, which has in it a photovoltaic layer comprised of pn junctions or pin junctions (not shown) and a transparent conductive layer 302 comprised of ITO in contact with a p-type semiconductor layer 301. This transparent conductive layer has a constant concentration ($C_{31}$) of tin. In this case, the concerned junction may well be shown in the band diagram in FIGS. 8 and 9. ITO, having its Fermi level above the lower end of the conduction band, is so called a degenerated semiconductor. The transparent conductive layer shown in FIG. 3 is considered to have a smaller work function $\phi$ with a smaller concentration of tin and a larger work function with a larger concentration of tin (Report of Research Laboratory of Engineering Shibaura Institute of Technology, vol. 3, pp. 35–55, 1988). If the electron affinity x is supposed to be the same as each other, the absolute value of a difference between the level (Ec) of the lower end of the conduction band and the Fermi level (Ef) is smaller in the case of a larger concentration of tin (FIG. 8, Eh2) than in the case of a smaller concentration of tin (FIG. 9, Eh1), i.e., Eh1>Eh2.

Also, the tunnel current is considered to be larger with a smaller band gap (Et) concerned with the tunnel current and smaller with a larger value of Et. The above consideration leads to a supposition of the following relationship:

$$Et1 < Et2$$

Figure 9:
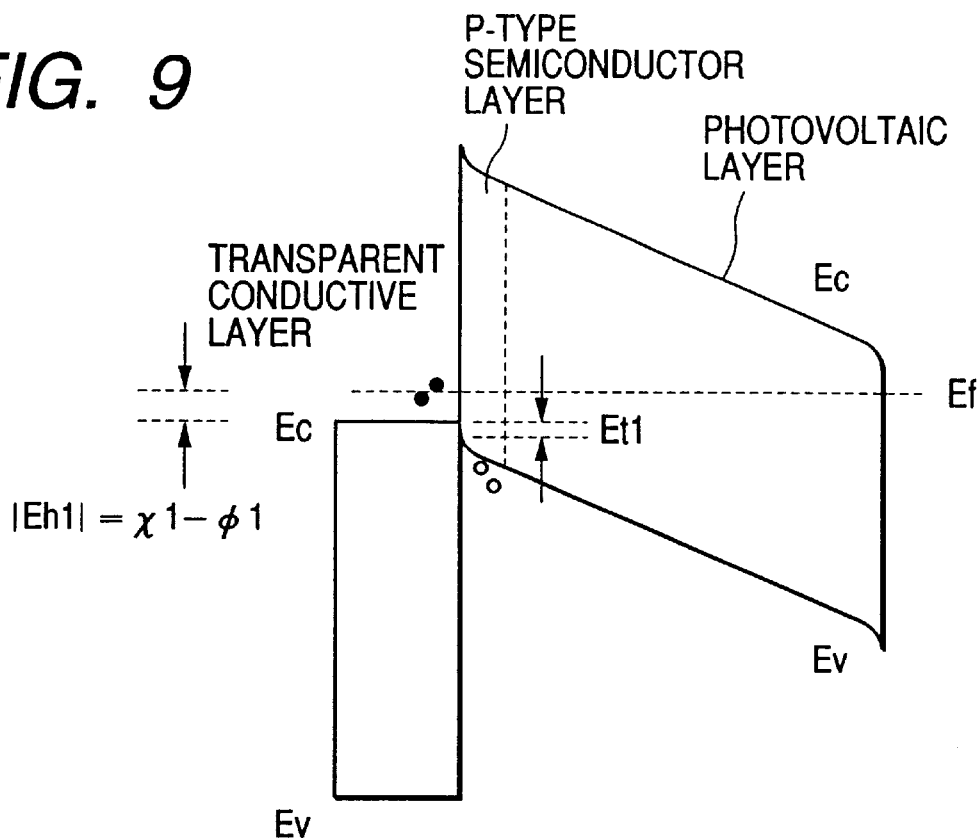
FIG. 9 is a diagram of a band of another conventional photovoltaic element.

Therefore, a band gap concerned with tunnel current is smaller in the case of FIG. 9 with a smaller concentration of tin, thus resulting in a larger flow tunnel current. If a tunnel current is small, the photovoltaic effect generated at the transparent conductive layer and the p-type semiconductor layer cannot be neglected. Therefore, it is considered that such a photovoltaic element is preferable to that of a type shown in FIG. 9, which has a larger tunnel current, i.e., having a small or zero concentration of tin. Actually, measurement of the solar cell characteristics of an amorphous silicon solar cell having pin junctions has shown that the type shown in FIG. 9 is preferable in terms of open circuit voltage (Voc), short-circuit current (Jsc), and photoelectric conversion efficiency ($\eta$).

However, the photovoltaic element having a transparent conductive layer shown in FIG. 9 suffers from, when exposed to a high temperature such as about 90° C. for a long time, increases in the specific resistance and sheet resistance, as well as degradations in the solar cell characteristics, particularly, fill factor (FF). However, the photovoltaic element shown in FIG. 8 has, as compared to that in FIG. 9, slightly degraded open circuit voltage (Voc), short-circuit current (Jsc), and photoelectric conversion efficiency ($\eta$), but its transparent conductive layer has an excellent thermal stability, so that even if exposed to a high temperature such as about 120° C., its specific resistance and sheet resistance are very stable and also that open-circuit voltage (Voc), short-circuit current (Jsc), and photoelectric conversion efficiency ($\eta$) are also thermally stable.

Figure 1:
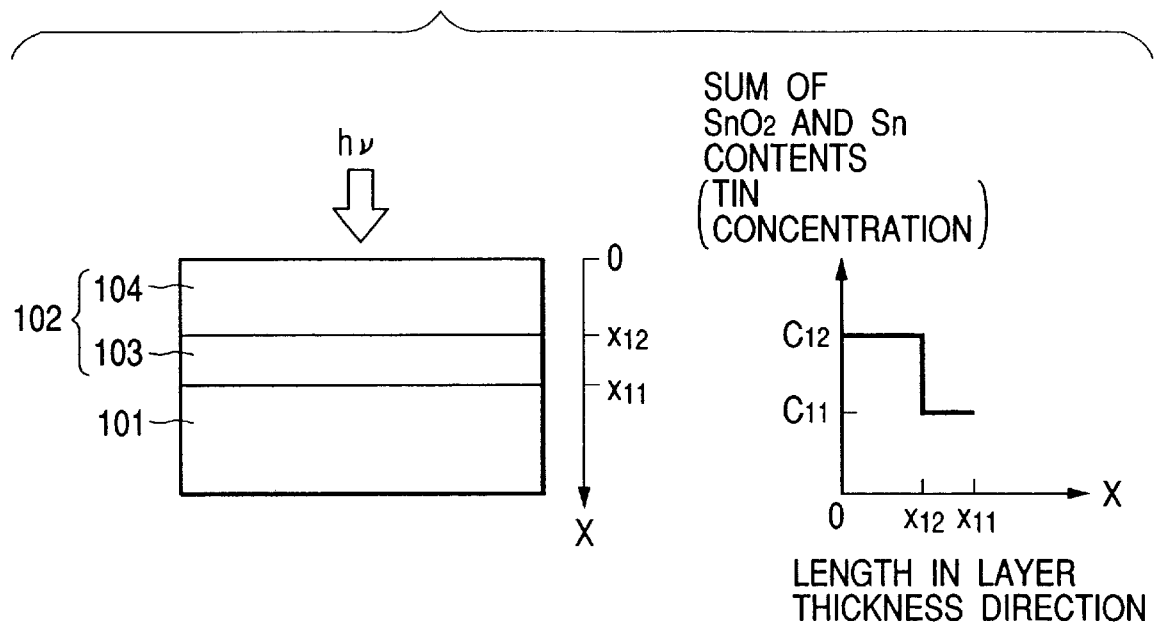
FIG. 1 shows a schematic partial cross-sectional view of a configuration of a photovoltaic element according to the present invention and a layer-thickness directional distribution of a sum of tin oxide content and tin content.
Figure 2:
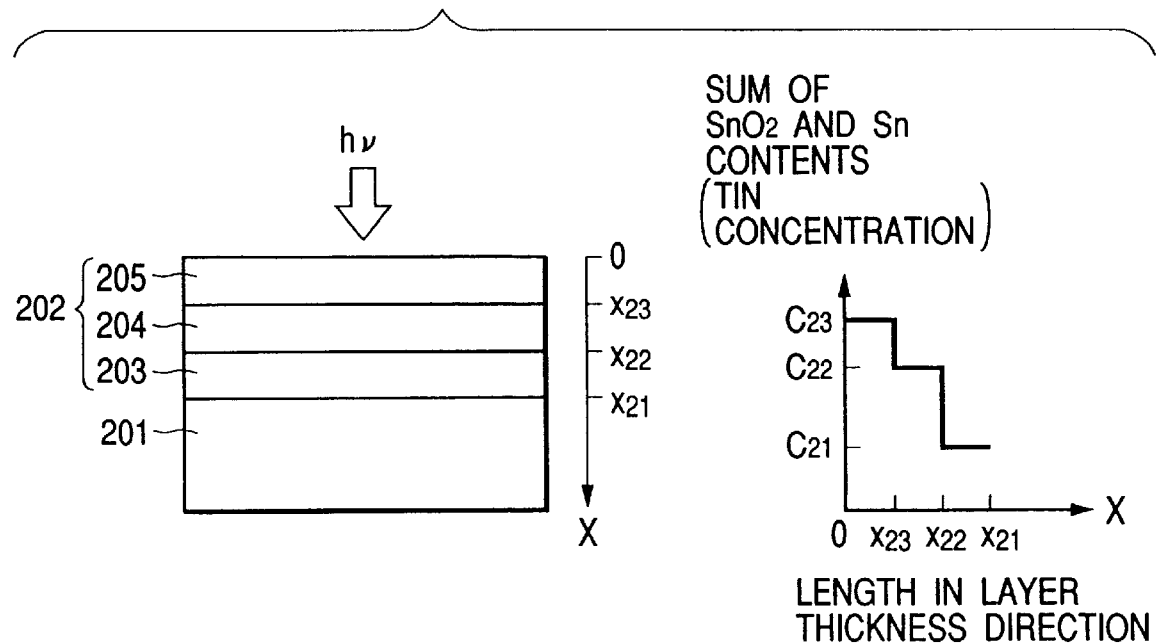
FIG. 2 shows a schematic partial cross-sectional view of another configuration of a photovoltaic element according to the present invention and a layer-thickness directional distribution of a sum of tin oxide content and tin content.
Figure 6:
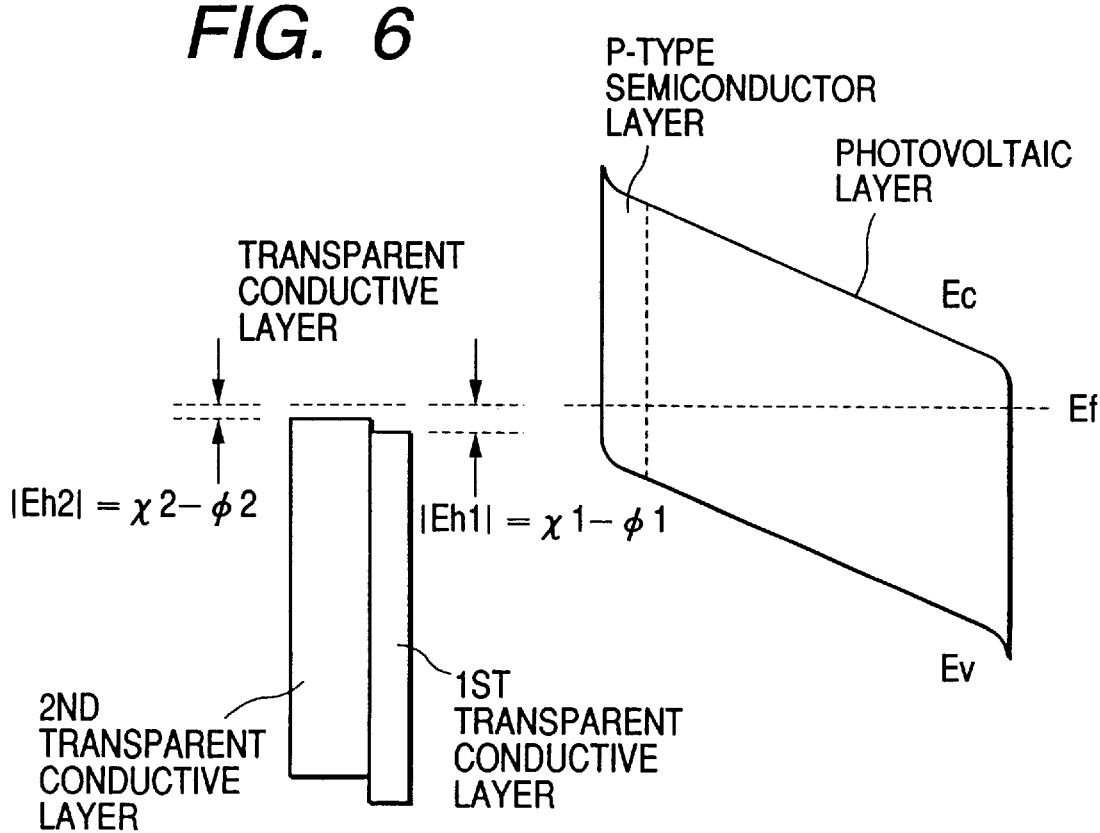
FIG. 6 is a diagram of a band of a photovoltaic element according to the present invention prior to junction.
Figure 7:
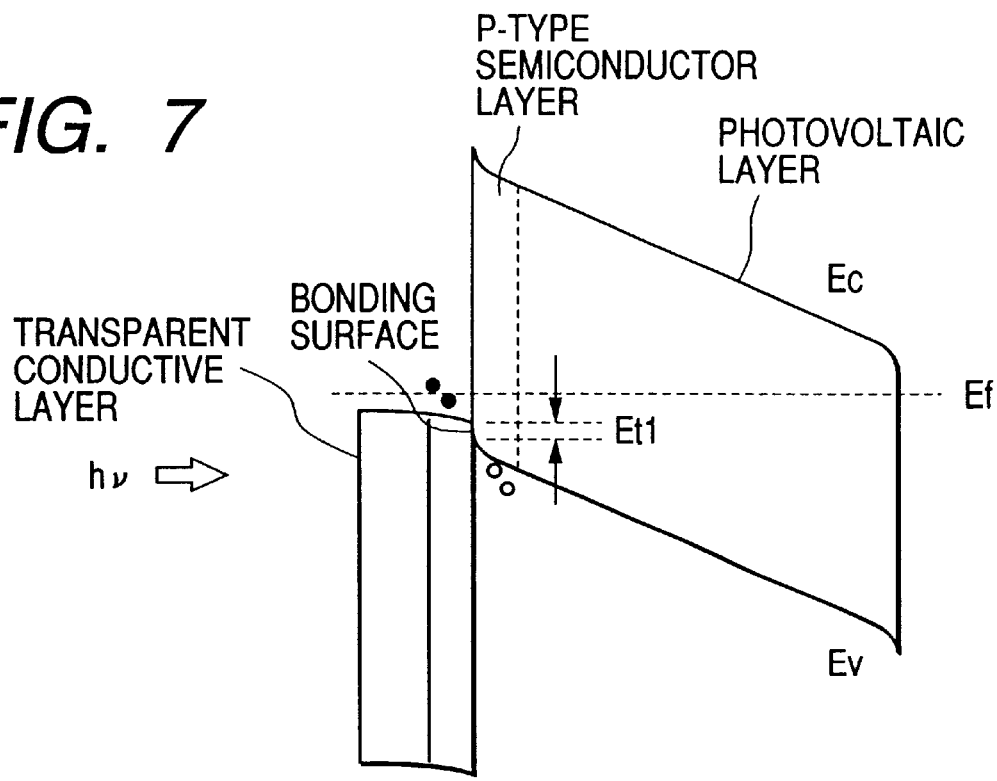
FIG. 7 is a diagram of a band of a photovoltaic element according to the present invention.
Figure 8:
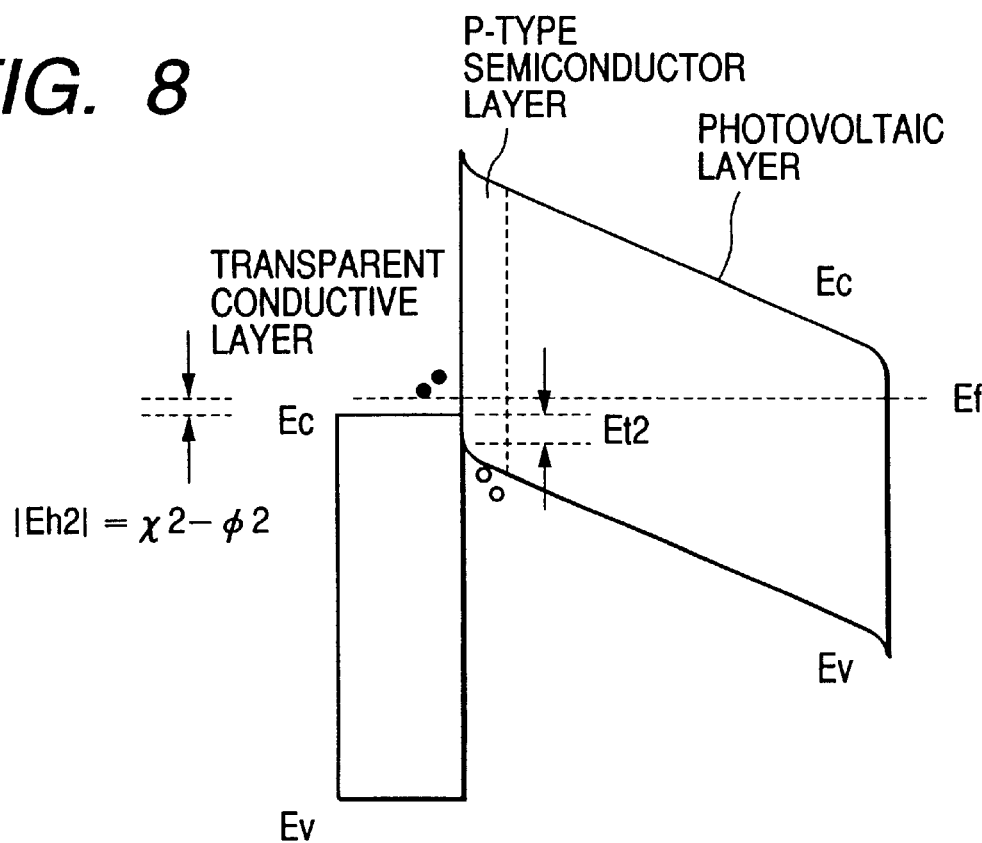
FIG. 8 is a diagram of a band of a conventional photovoltaic element.

The present invention makes use of advantages of respective types shown in FIGS. 8 and 9 and, at the same time, eliminates their disadvantages. FIG. 1 is a schematic partial cross-sectional view of one embodiment of the photovoltaic element according to the present invention, in which example, a transparent conductive layer 102 consists of a stack of two layers. That is, in the case of FIG. 1, a first transparent conductive layer 103 and a second transparent conductive layer 104 are sequentially stacked on a p-type semiconductor layer 101, with the first transparent conductive layer 103 having a concentration smaller than that of the second transparent conductive layer 104. FIGS. 6 and 7 show band diagrams of the photovoltaic element shown in FIG. 1. In a first transparent conductive layer, which has a smaller concentration of tin, the energy gap concerned with the tunnel current Et1 is relatively small. Therefore, the tunnel current becomes larger to inhibit undesired photovoltaic effect from being generated, thereby providing better open-circuit voltage (Voc), short-circuit current (Jsc), and photoelectric conversion efficiency (η). FIG. 2 is a schematic partial cross-sectional view of one embodiment of the photovoltaic element according to the present invention, in which on a p-type semiconductor layer 201 is formed a transparent conductive layer 202 comprised of a first transparent layer 203, a second transparent conductive layer 204, and a third transparent conductive layer 205.

Figure 10:
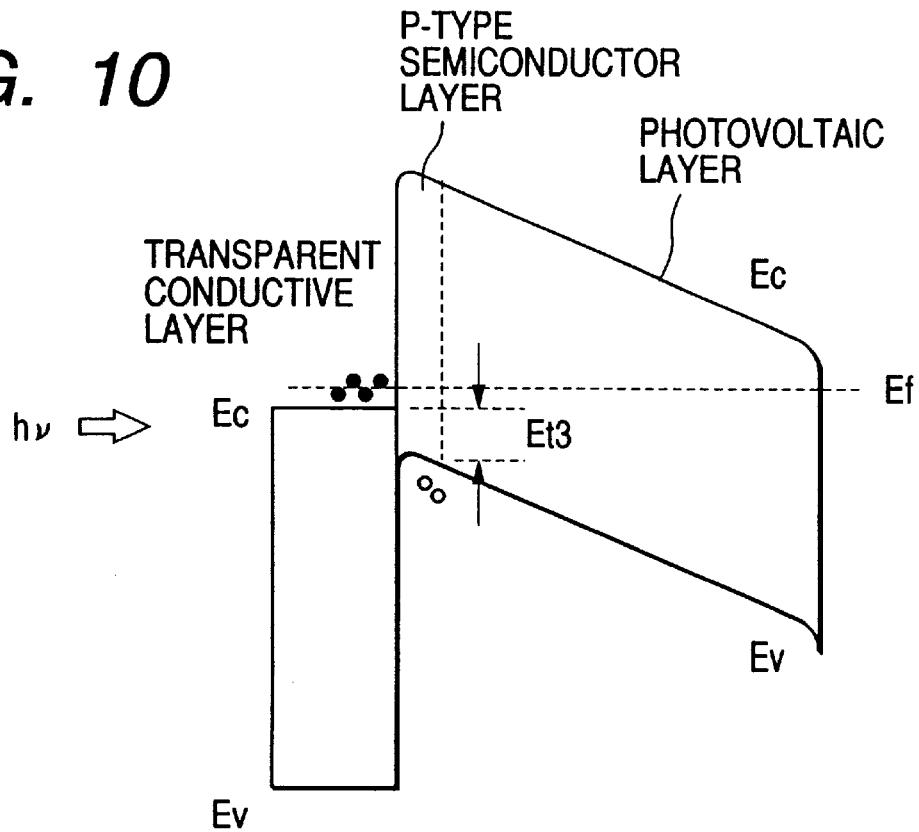
FIG. 10 is a diagram of a band of another conventional photovoltaic element.

In the conventional photovoltaic elements, it is considered that if a great deal of tin oxide or tin is present near the interface, the concerned region has a larger carrier concentration, so that caused by mirror image force, the energy band is made to curve as FIG. 10. With this, essentially the energy gap Et3 concerning the tunnel current becomes even larger, decreasing the tunnel current with loss which is as much as photovoltaic effect. It is considered that photovoltaic elements according to the present invention have a relatively small concentration of tin concentration in the first transparent conductive layer near the junction surface and so have a smaller carrier concentration, eliminating undesired curves of the band near the junction surface of the p-type semiconductor layer, as shown in FIG. 10. Therefore, the tunnel current becomes larger, thus giving excellent open-circuit voltage, short-circuit current, and photoelectric conversion efficiency of the photovoltaic elements according to the present invention.

Moreover, since the second transparent conductive layer having a larger concentration of tin is stacked on the first transparent conductive layer, an excellent thermal stability can be obtained. Moreover, since the refractive index n2 of the second transparent conductive layer is larger than the refractive index n1 of the first transparent conductive index, when the refractive index of a material of the photovoltaic layer is larger than n2, the light trapping effect increases to further increase the short-circuit current. Also, since the first transparent conductive layer functions as a buffer layer against internal stress, the transparent conductive layers of a photovoltaic element according to the present invention is very difficult to be peeled off. Since the tin concentration particularly near the junction surface is small to promote stress relaxation, the interface state is very low, thus providing excellent photoelectric characteristics. Also, according to the present invention, the specific resistance is smaller at the transparent conductive layers (the second transparent conductive layer 124 in FIG. 1 and the third transparent conductive layer 205 in FIG. 2) distant from the junction surface than at those (the first transparent conductive layers 103 and 203 in FIGS. 1 and 2) near the junction surface, so that light carriers generated from the photovoltaic layer move in the layer-thickness direction inside the transparent conductive layer near the junction surface and in the into-the-surface direction inside the transparent conductive layer distant from the junction surface. Therefore, the interaction due to the movement of carriers near the junction surface or inside the p-type semiconductor layer is decreased, thus increasing the tunnel current.

Figure 4:
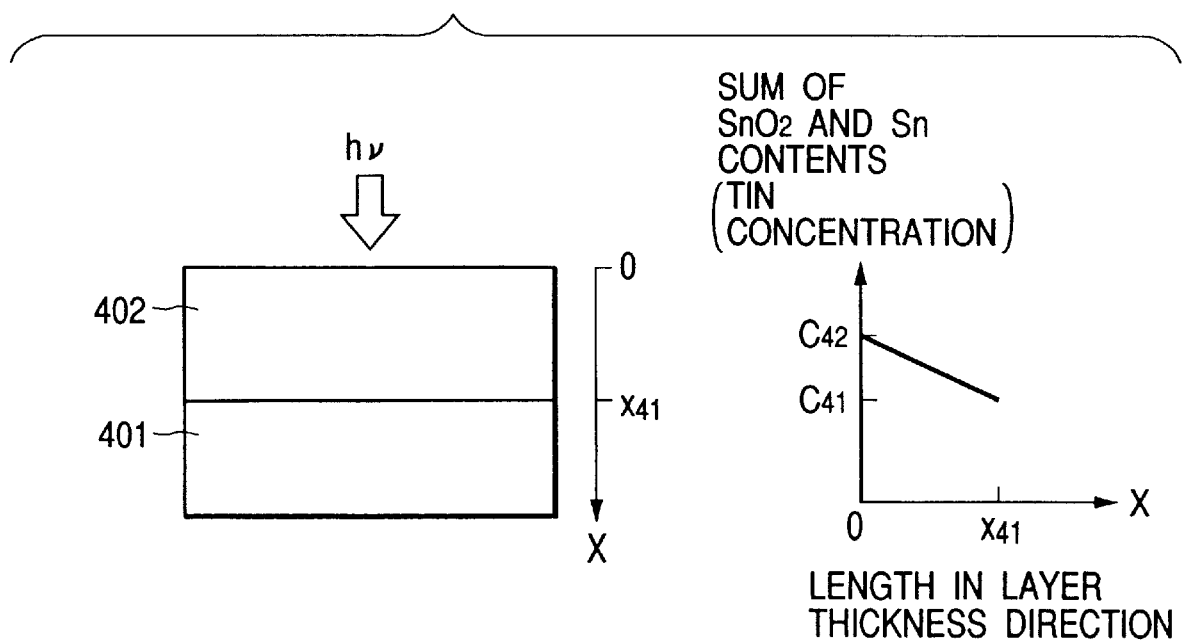
FIG. 4 shows a schematic partial cross-sectional view of another configuration of a photovoltaic element according to the present invention and a layer-thickness directional distribution of a sum of tin oxide content and tin content.
Figure 5:
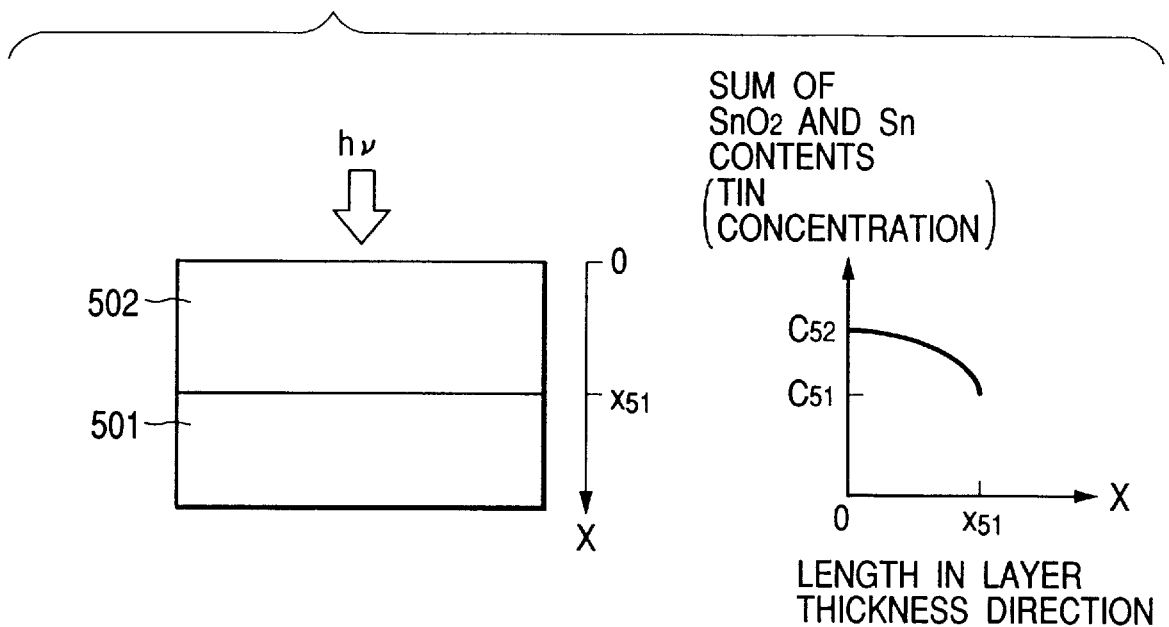
FIG. 5 shows a schematic partial cross-sectional view of another configuration of a photovoltaic element according to the present invention and a layer-thickness directional distribution of a sum of tin oxide content and tin content.

The above-mentioned effects can be obtained mostly the same with a photovoltaic element shown in FIG. 2 that has a three-layer stacked transparent conductive layer and also wherein the tin concentration starts to increase at the junction surface. Also, the above-mentioned effects can be exerted furthermore for photovoltaic elements shown in FIGS. 4 and 5 wherein the tin concentration starts to increase continuously at the junction surface. That is, by continuously changing the concentration of tin oxide or tin, the interface between the first and second transparent conductive layers can be eliminated, thus providing an advantage in the case where an interface state is present at the concerned interface. Since there is no interface state, power loss due to increases in resistance is eliminated. Note here that FIGS. 4 and 5 are both schematic partial cross-sectional views showing the embodiments of the photovoltaic element according to the present invention.

Also, according to the present invention, transparent conductive layers may be stacked on p-type semiconductor layers or vice versa. In addition, the light incidence direction may be from the side of the transparent conductive layer or the photovoltaic layer to exert the effects by the present invention.

One preferred embodiment of the present invention is characterized in that the concentration of tin of the layer closest to the junction surface is 10 mole % or less. Another embodiment wherein the tin concentration changes continuously is characterized in that the concerned concentration becomes a minimum at the junction surface, i.e., 10 mole % or less. With this, an energy gap related to the tunnel current becomes even smaller to further increase it, thus exerting the above-mentioned effects even more conspicuously.

Another preferred embodiment of the present invention is characterized in that the tin maximum concentration of any layer is between 12 mole % and 30 mole %, both inclusive. Also, another preferred embodiment in which the tin concentration changes continuously is characterized in that the tin concentration in its maximum region is between 2 mole % and 30 mole %, both inclusive. With this, the thermal stability of photovoltaic elements when exposed to a high temperature can be further improved. This improvement exerts the above-mentioned effects even more conspicuously.

Another preferred embodiment of the present invention is characterized in that the layer thickness of a region where the tin concentration near the junction surface is 10 mole % or less is a half or less of the entire thickness of the ITO layer. With this, the thermal stability of photovoltaic elements when exposed to a high temperature can be further improved. This improvement exerts the above-mentioned effects even more conspicuously.

Another preferred embodiment of the present invention is characterized in that the layer thickness in a region where the tin concentration is 12 mole % or higher is a half or larger of the entire thickness of the ITO layer. With this, the thermal stability of photovoltaic elements when exposed to a high temperature can be further improved. This improvement exerts the above-mentioned effects even more conspicuously.

Another preferred embodiment of the present invention is characterized in that the film thickness of transparent conductive layers is adjusted so that the intensity of reflected light may be a minimum at the wavelength at which the intensity of illumination light becomes a maximum. With this, the short-circuit current for photovoltaic elements is increased.

Configuration of Transparent Conductive Layers

The transparent conductive layers employed in the present invention are comprised of indium tin oxide (ITO) and may be in a polycrystalline, microcrystalline, or amorphous state. Of these states, the crystalline state makes it possible to obtain a lower specific resistance and a higher transmittance. A forming temperature of 100° C. or higher is preferable in order to form crystalline indium tin oxide layers. To further improve the transmittance, the forming temperature should preferably be 150° C. or higher. When the underlying layer is not a p-type semiconductor layer when forming transparent conductive layers, the forming temperature should preferably be 300° C. or higher. If the underlying layer is a p-type semiconductor layer, it is necessary to optimize the forming temperature for the concerned layers in order to obtain even a slightly higher conversion efficiency. Generally, however, an appropriate forming temperature for the underlying p-type semiconductor layers is 400° C. or lower. This is because that temperature is important to prohibit the dopants, etc., in the p-type semiconductor layer from being mutually diffused into other layers in order to increase the open-circuit voltage. It is also preferable to form this layer at a highest possible temperature to make its surface uneven, thus making the best use of the light trapping effect. It is also preferable to adjust the film thickness so that reflection becomes a minimum at a wavelength at which the illumination light intensity becomes a maximum, thereby absorbing the illumination light into the photovoltaic layer as much as possible. When transparent conductive layers according to the present invention are used in a crystalline state, their orientation should preferably be a (100) or (111) surface in order to grow larger crystal particles even with a lower specific resistance and a higher transmittance. With this, it is also easy to form uneven structures in the surface.

How to Form Transparent Conductive Layers

The methods of forming transparent conductive layers in the photovoltaic element according to the present invention include the spray method, the CVD method, the application method, the resistance heating vacuum evaporation method, and the sputtering method, of which the resistance heating vacuum evaporation method, the electron-beam vacuum evaporation method, or the sputtering method is the most appropriate, because it enables forming good junction surfaces with semiconductor layers. When using the resistance heating vacuum evaporation method or the electron-beam vacuum evaporation method, it is preferable to evaporate a metal evaporation source containing indium and tin at a pressure of $7 \times 10^{-2}$ Pa while heating the source subjected to oxygen gas. If compared at the same temperature, however, the vapor pressure of tin is much lower than that of indium, so that in order to provide an approximately 1 mole % tin concentration in transparent conductive layers, their weight ratio needs to be In:Sn=1:1 or so, while in order to provide an approximately 10 mole % tin concentration, their weight ratio needs to be In:Sn=1:10 or so. The sputtering method, particularly the DC magnetron sputtering method is optimal because it provides a higher deposit rate and better junction surfaces. Preferably, the forming temperature is 150° C. or higher, and the target voltage is −200 V to −500 V or so. Also, as a sputtering gas, a mixture of argon and oxygen as well as neon, helium, and other light gases is preferable to reduce the plasma-damages at the junction surface. In addition, the substrate may be electrically floated or a bias may be adjusted so as to control electron current or ion current flowing into the substrate. A voltage of −50 V or higher is preferable, and especially preferable is a voltage of +200 V or so in order to reduce ion current and plasma-damages.

In order to change the tin concentration in the layer-thickness direction, electric power applied to the target or the evaporation source may be controlled independently. When the sputtering method is employed, by preparing both a target comprised of indium oxide and another target comprised of tin oxide and tin beforehand, electric power onto the tin oxide target should be increased in order to provide a higher content of tin oxide. In order to provide a higher content of tin, on the other hand, electric power onto the tin target should be increased. When the resistance heating vacuum evaporation is employed, by preparing both an indium evaporation source and a tin evaporation source, the temperature for the tin evaporation source should be increased in order to provide a higher concentration of tin.

Photovoltaic Layer

The photovoltaic layer may be of any junction aspect as long as its configuration will generate photovoltaic effect when exposed to light irradiation. The junction aspects preferred include the pn junction, pin junction, $p^+$ $p^-$ $n^+$ junction, and $p^+$ $n^-$ $n^+$ junction. The materials for photovoltaic layers include Si, Ge, SiGe, SiC, CdS, CdTe, CdSe, $Cd_xZn_{1-x}S$, GaAs, $Ga_xAl_{1-x}As$, $GaInP_2$, InP, $CuInSe_2$, $CuIn_xGa_{1-x}Se_2$, $Cu_2S$, ZnO, $Zn_3P_2$, and Se. The junction may be formed in a homostructure using the same kind of materials or a heterostructure using different kinds of materials. The state of the materials also may be monocrystal, polycrystal, microcrystalline, or amorphous, sometimes coming in a hetero-junction of polycrystal and amorphous states. The photovoltaic layers of the present invention may have a plurality of junctions. Those junctions may also be formed in series or have insulating layers inserted between themselves. They also may have different kinds of junctions such as a pn junction and a pin junction.

The methods of forming photovoltaic layers include the plasma-enhanced CVD method, the photo-assisted CVD method, the thermal CVD method, MOCVD method, the MBE method, the gas diffusion method, the solid-phase diffusion method, the liquid-phase growth method, the ion implantation method, the resistance heating vacuum evaporation method, the spray method, the sputtering method, and the electro-deposition method, of which, however, the most appropriate method must be selected depending on materials and junction aspects to be employed. Also a plurality of methods may be used when forming junctions for the photovoltaic layer.

In order to form junctions by depositing thin-films of Si, Ge, SiGe, or SiC, the plasma enhanced CVD method, the photo-assisted CVD method, and the thermal CVD method are preferable. In order to form junctions within the substrate, the gas diffusion method, the solid-phase diffusion method, and the ion implantation method are preferable. In order to form the i-layer, in particular, the RF plasma-enhanced CVD method using a frequency of 1 to 30 MHz, the VHF plasma-enhanced CVD method using a frequency of 30 MHz to 0.5 GHz, and the microwave plasma-enhanced CVD method using a frequency of 0.5 GHz to 10 GHz are preferable. In order to form junctions by depositing thin-films of CdS, CdTe, CdSe, or $Cd_xZn_{1-x}S$, the resistance heating vacuum evaporation method, the MBE method, the sputtering method, the electro-deposition method, the plasma-enhanced CVD method, and the photo-assisted CVD method are preferable. In order to form junctions by depositing thin-films of GaAs, $Ga_xAl_{1-x}As$, $GaInP_2$, or InP, the MBE method, the MOCVD method, and the liquid-phase growth method are preferable, while in order to form junctions within the substrate, the gas diffusion method, the solid-phase diffusion method, and the ion implantation method are preferable. In order to form junctions by depositing thin-films of $CuInSe_2$, $CuIn_xGa_{1-x}Se_2$, $Cu_2S$, or $ZnO$, the resistance heating vacuum evaporation method, the MBE method, and the sputtering method are preferable. In order to form junctions by depositing $Zn_3P_2$ thin-films, the ICB method and the MOCVD method are preferable. In order to form junctions by depositing Se thin-films, the resistance heating vacuum evaporation method and the sputtering method are preferable.

After the junctions are formed by the above-mentioned methods, annealing may be carried out for re-crystallization or improvement of the junction quality.

p-Type Semiconductor Layer

The p-type semiconductor layer is junctioned with transparent conductive layers, being comprised of a material having the p-type conductivity of many photovoltaic materials used for the photovoltaic layer. The material may be Si, Ge, SiGe, SiC, CdTe, GaAs, $Ga_xAl_{1-x}As$, $GaInP_2$, InP, $CuInSe_2$, $CuIn_xGa_{1-x}Se_2$, $Cu_2S$, $Zn_3P_2$, or Se. The material may also be in such a state as a monocrystalline, polycrystalline, microcrystalline, or amorphous state, so that different states of, for example, polycrystalline and amorphous states, may be used to stack a plurality of layers.

The methods of forming p-type semiconductor layers include the plasma-enhanced CVD method, the photo-assisted CVD method, the thermal CVD method, the MOCVD method, the gas diffusion method, the solid-phase diffusion method, the liquid-phase diffusion method, the ion implantation method, the resistance heating vacuum evaporation method, the spray method, the sputtering method, and the electrodeposition method, of which, however, the most appropriate method must be selected depending on the material and the junction aspect to be employed. This method of forming p-type semiconductor layers is to be in accordance with the above-mentioned method of forming photovoltaic layers.

Photovoltaic Element

Figure 12:
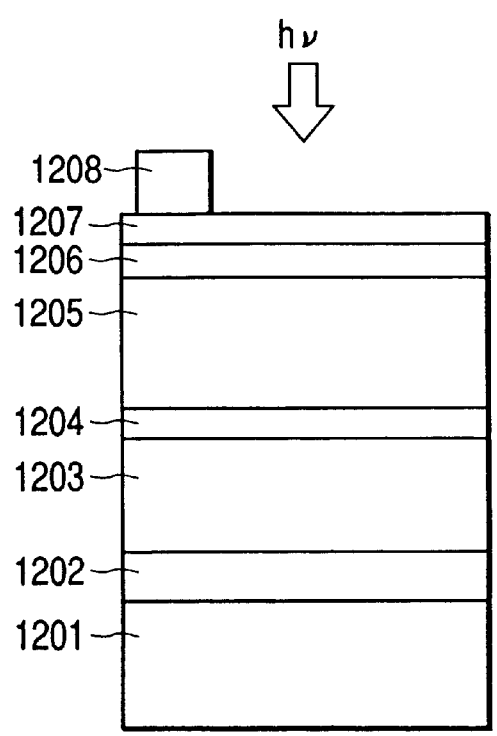
FIG. 12 is a schematic cross-sectional view of an embodiment of a photovoltaic element according to the present invention.

FIG. 12 shows a schematic cross-sectional view of the specific configuration of one example of the photovoltaic element according to the present invention. FIG. 12 illustrates a pin-type solar cell employing a non-monocrystalline silicon-based semiconductor. In FIG. 12, reference numeral 1201 indicates a support structure which has a function to support a photovoltaic element and which can be glass, stainless steel, heat-resistant resin sheet, etc. Reference numeral 1202 indicates a reflecting layer which has functions as a back-surface electrode and also a back-surface reflecting function and which can be Ag, Al, Au, Cu, CuMg, etc. Reference numeral 1203 indicates a lower transparent conductive layer which has functions to prevent short-circuiting of photovoltaic layers and also a light trapping function and which can be zinc oxide, tin oxide, indium oxide, ITO etc. Reference numerals 1204, 1205, and 1206, respectively, indicate an n-type semiconductor layer, an i-type semiconductor layer, and a p-type semiconductor layer; and by junctioning these layers, the pin junctions can be formed to generate photovoltaic effect. The stacked structure comprised of these three types of layers is called a photovoltaic layer. The materials used for that are mentioned earlier. Reference numeral 1207 indicates a transparent conductive layer comprised of indium tin oxide, coming in a stacked structure consisting of two layers or more in which the tin concentration changes in the layer-thickness direction. This transparent conductive layer has a function to lead a larger amount of light to the photovoltaic layer and another function to lead light carriers to the collecting electrode effectively, i.e., with a smaller power loss. Reference numeral 1208 indicates the collecting electrode which has a function to effectively lead light carriers outside and another function to lead light to the photovoltaic layer effectively. The materials to be employed include Ag, Al, Au, Cu, etc.

Figure 13:
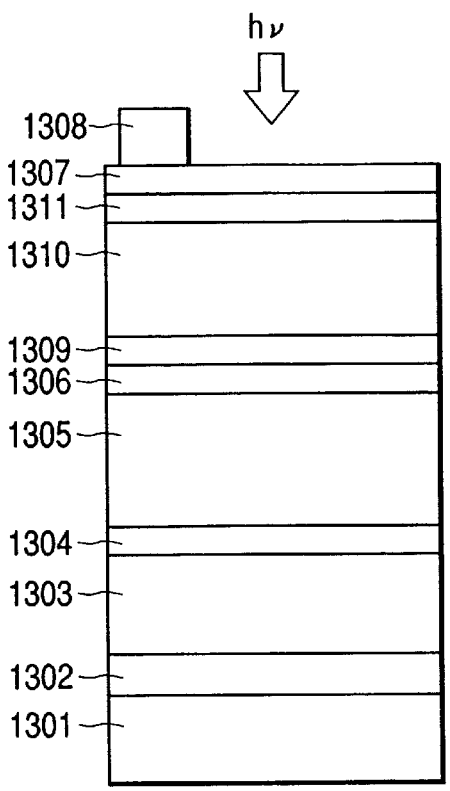
FIG. 13 is a schematic cross-sectional view of another embodiment of a photovoltaic element according to the present invention.

FIG. 13 is a schematic cross-sectional view of a photovoltaic element, which is a pinpin-type tandem non-monocrystalline silicon-based solar cell. The materials and functions of each layer are almost the same as those in FIG. 12.

In FIG. 13, reference numeral 1301 indicates a support structure, reference numeral 1302 indicates a reflecting layer, reference numeral 1303 indicates a lower transparent conductive layer, reference numeral 1304 indicates a first n-type semiconductor layer, reference numeral 1305 indicates a first i-type semiconductor layer, reference numeral 1306 indicates a first p-type semiconductor layer, reference numeral 1307 indicates a transparent conductive layer, reference numeral 1308 indicates a collecting electrode, reference numeral 1309 indicates a second n-type semiconductor layer, reference numeral 1310 indicates a second i-type semiconductor layer, and reference numeral 1311 indicates a second p-type semiconductor layer.

Figure 14:
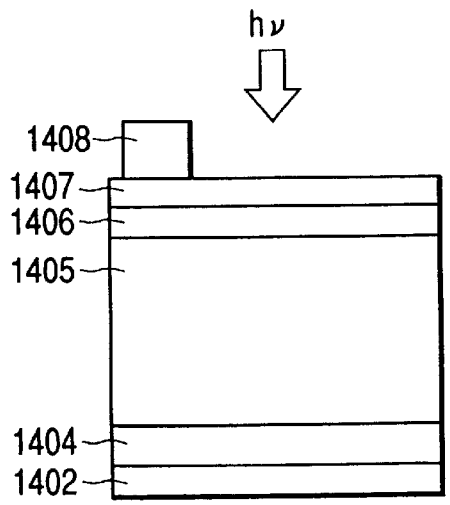
FIG. 14 is a schematic cross-sectional view of another embodiment of a photovoltaic element according to the present invention.

FIG. 14 is a schematic cross-sectional view of another example of a photovoltaic element, which is a $p^+ n^- n^+$-type monocrystalline silicon-based solar cell. Reference numeral 1405 indicates an $n^-$-type semiconductor layer consisting of an $n^-$-type monocrystalline silicon substrate which is prepared by the pull method and then into which phosphorous (P) is doped. Reference numeral 1404 indicates an $n^+$-type semiconductor layer which is prepared by implanting phosphorous ions into the back surface of the concerned $n^-$-type monocrystalline silicon substrate. Reference numeral 1406 indicates a $p^+$-type semiconductor layer which is prepared by implanting boron ions into the surface of the concerned $n^-$-type monocrystalline silicon substrate. These layers indicated by reference numerals 1404, 1405, and 1406 will, in combination, generate photovoltaic effect and their stacked structure is called a photovoltaic layer. Reference numeral 1402 indicates a reflecting layer which serves also as a back-surface electrode, having a function as an electrode and also as a layer to reflect light being comprised of Al, etc. Reference numerals 1407 and 1408, respectively, function the same as the transparent electrode layer 1207 and the collecting electrode 1208.

FIG. 5 is a schematic cross-sectional view of another example of a photovoltaic element, which causes the light to enter from the side of a support structure 150. The support structure 1501, therefore, needs to be transparent. On the support structure 1501 are sequentially stacked a transparent conductive layer 1507, a p-type semiconductor layer 1506, an i-type semiconductor layer 1505, an n-type semiconductor 1504, and a reflecting layer 1502.

Experiments

To investigate the effects by the present invention, a sample of such a stacked structure was prepared that consists of a transparent conductive layer, a p-type semiconductor layer, and a substrate in this order.

Experiment 1

Figure 11:
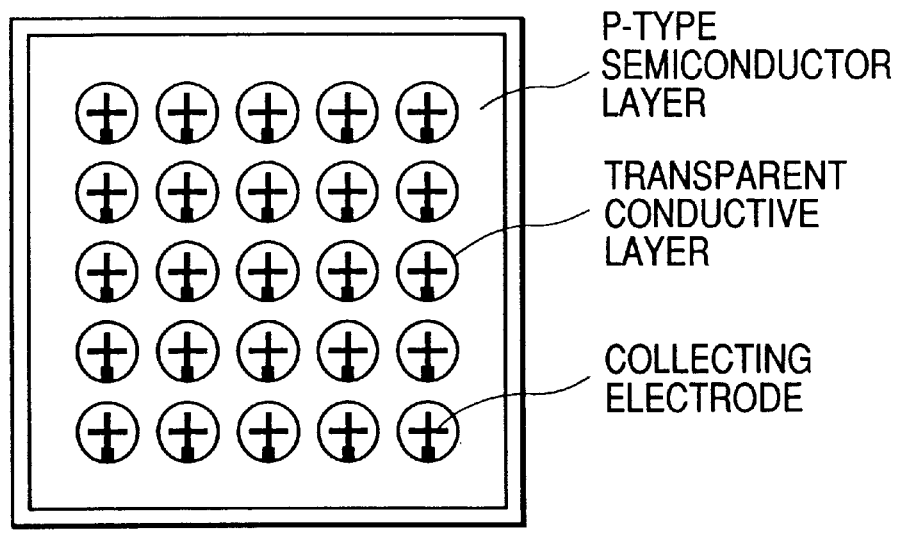
FIG. 11 is an outer appearance view of a sample solar cell used in experimental examples and embodiments.

First, as a substrate, a stainless plate (50 mm×50 mm×1 mm (thickness)) which had undergone specular polishing was provided, and on it, as a p-type semiconductor layer, a p-type microcrystalline silicon ($\mu$c-Si:H:B) was formed by RF plasma-enhanced CVD. On it was formed a transparent conductive layer 102 using a DC magnetron sputtering apparatus having in it four targets, as shown in FIG. 1. Specifically, a mask having in it 25 openings with 6-mm diameter was placed on a p-type semiconductor layer 101 and then placed in the DC magnetron sputtering apparatus to sequentially form a first transparent conductive layer 103 and a second transparent conductive layer 104 under such conditions as listed in Table 1. Then, the heater was turned off, and when the temperature reached approximately room temperature, a mask having in it cross-shaped openings was applied to form collecting electrodes comprised of Al on the second transparent conductive layer 104, thereby completely preparing a sample shown in FIG. 11 as viewed from the top.

When the voltage-current characteristic of this sample under dark conditions was checked, it was found to be ohmic. Also, when its voltage-current characteristic was checked by applying a light of AM 1.5 and 100 mW/cm$^2$, no photovoltaic effect was detected.

Next, in much the same manner as mentioned above, a p-type semiconductor layer 101, a first transparent conductive layer 103, and a second transparent conductive layer 104 were stacked on a glass-made substrate. When measured by the four-probe method, the sheet resistance of the transparent conductive layer 102 was 48.0 Ω/□. Then, the sample was placed in a high-temperature environmental testing machine held at 120° C. and allowed to stand in it for 1000 hours, whereupon the sheet resistance of the transparent conductive layer 102 was measured to be 50.8 Ω/□. The layer forming conditions and the results are summarized in Table 1.

Comparative Experiment 1-1

Next, the first transparent conductive layer was checked in terms of its single-film characteristics. Like in Experiment 1, on a stainless-steel substrate was formed a p-type semiconductor layer, on which in turn was formed a transparent conductive layer with a film thickness of 60 nm, on which in turn was formed cross-shaped collecting electrodes. The voltage-current characteristic of this sample under dark conditions was checked and found to be ohmic. When the voltage-current characteristic was checked by applying a light of AM 1.5 and 100 mW/cm$^2$, no photovoltaic effect was detected. Next, on a glass-made substrate was formed a p-type semiconductor layer, on which in turn was formed a first transparent conductive layer with a film-thickness of 60 nm, and then the resulting sample was measured for its sum of indium content and tin content (tin concentration) by the ICP method to be found to be 5.1 mole %. Also, the initial sheet resistance and the sheet resistance after a time lapse of 1000 hours at a temperature of 120° C. were measured like in Experiment 1 and found to be 70.4 Ω/□ and 85.1 Ω/□, respectively. The layer forming conditions and the results are summarized in Table 2.

Comparative Experiment 1-2

Next, the second transparent conductive layer was checked for its single-film characteristics. Like in Experiment 1, on a stainless-steel substrate was formed a p-type semiconductor layer, on which in turn was formed a second transparent conductive layer with a film-thickness of 60 nm, on which in turn was formed cross-shaped collecting electrodes. The voltage-current characteristic of this sample under dark conditions was somewhat rectifying. Also, when checked by applying a light of AM 1.5 and 100 mW/cm$^2$, the voltage-current characteristic was found to minimally generate photovoltaic effect. Next, on a glass-made substrate was formed a p-type semiconductor layer, on which in turn was formed a second transparent conductive layer with a film-thickness of 60 nm; and the resultant tin concentration was measured by the ICP method to be 10.3 mole %. Also, like in Experiment 1, the initial sheet resistance and the sheet resistance after a time lapse of 1000 hours at a temperature of 120° C. were measured to be 42.1 Ω/□ and 44.3 Ω/□, respectively. The layer forming conditions and the results are summarized in Table 3.

Experiment 2

The same sample as that in Experiment 1 was prepared and evaluated similarly except that the first transparent conductive layer was formed by the resistance heating vacuum evaporation method and also that such a target for forming the second transparent conductive layer was employed that has a tin oxide content of 15 mole %. The conditions and the results are summarized in Table 4.

Comparative Experiment 2-1

Next, the first transparent conductive layer formed in Experiment 2 was checked for its single-film characteristics. Like in Comparative Experiment 1-1, on a stainless-steel substrate were formed a p-type semiconductor layer and a first transparent conductive layer, and a collecting electrode, in this order, to give a sample, while on a glass-made substrate were formed a p-type semiconductor layer and a first transparent conductive layer, in this order, to give another sample; then they were checked for their current-voltage characteristic, tin concentration, and initial sheet resistance and then underwent heat-run tests. The layer forming conditions and the results are summarized in Table 5.

Comparative Experiment 2-2

Next, the second transparent conductive layer formed in Experiment 2 was checked for its single-film characteristics. Like in Comparative Experiment 1-2, on a stainless-steel substrate were formed a p-type semiconductor layer, a second transparent conductive layer, and collecting electrodes to prepare a sample, while on a glass-made substrate were formed a p-type semiconductor layer and second transparent conductive layer to prepare another sample, so that these two sample were tested to determine their current-voltage characteristic and initial sheet resistance and also underwent heat run tests. The layer forming conditions and the results are summarized in Table 6.

As can be seen from these experimental examples, the transparent conductive layer having a configuration shown in FIG. 1 of the present invention was found to form ohmic junctions with p-type semiconductor layers, to generate no photovoltaic effect, and to be excellent in thermal stability.

Experiment 3

The single-film characteristics were summarized for each of various values of the concentrations of transparent conductive layers. The results are summarized in Table 7. The same evaluation method was taken as Experiments 1 and 2. In this case, the layers were formed by the DC magnetron sputtering method to change the content of tin oxide contained in a target, thereby varying the tin concentration in the transparent conductive layers. As can be seen from this table, when the tin concentration is in a range of 12 mole % to 30 mole %, both inclusive, the sheet resistance is low and the thermal stability is high.

Experiment 4

This experiment was conducted using a sputtering target containing metal tin. By changing the metal tin content in the target, the tin concentration in transparent conductive layers was varied. The results have shown that when the tin concentration is in a range of 12 mole % to 30 mole %, both inclusive, the sheet resistance is low and the thermal stability is high.

Experiment 5

This experiment was conducted on various values of tin concentration in transparent conductive layers using the resistance heating vacuum evaporation method and the electron-beam vacuum evaporation method. This experiment was carried out in the same manner as Experiment 3, except for the method of forming transparent conductive layers. The results have shown that when the tin concentration is in a range of 12 mole % to 30 mole %, both inclusive, the sheet resistance is low and the thermal stability is high irrespective of the forming method employed.

Experiment 6

The experiment was conducted on, as a p-type semiconductor layer, polycrystalline $CuInSe_2$ with a film-thickness of 50 nm formed by the seleniding method. In this experiment, a stacked layer comprised of Cu/In formed by the vacuum evaporation method was selenided by undergoing heat treatment in a Se vapor. First, as a substrate, a glass-made substrate on which Mo was sputtered was used; it then was heated to 450° C. at a rate of 200° C./minute, underwent irradiation for 60 minutes by selenium vapor from a Se vapor source to form a sample, and was cooled slowly at a rate of 1° C./minute down to 300° C., whereupon the irradiation by selenium vapor was stopped. It was further cooled slowly at a rate of 1° C./minute to sequentially form 25 first transparent conductive layers with a 6-mm diameter, another 25 second transparent conductive layers, and cross-shaped Al-made collecting electrodes.

When its voltage-current characteristic under dark conditions was checked, the sample was found to be ohmic. Also, when a light of AM 1.5 and 100 mW/cm² was applied to check its voltage-current characteristic, the sample was found to generate no photovoltaic effect.

Next, likewise, a p-type semiconductor layer, a first transparent conductive layer, and a second transparent conductive layer were stacked on a glass-made substrate in much the same manner as above. The sheet resistance was measured by the four-probe method and found to be 45.2 Ω/□. Then, the sample was placed in a high-temperature environmental testing machine held at 120° C., allowed to stand there for 1000 hours, and then measured for its sheet resistance which was found to be 47.8 Ω/□.

Comparative Experiment 6-1

Next, the first transparent conductive layer was checked for its single-film characteristics. Like in Experiment 6, on a Mo/glass-made substrate was formed a p-type semiconductor layer comprised of $CuInSe_2$ in the same manner as Experiment 6, on which in turn was formed a first transparent conductive layer with a 60-nm thickness in the same manner as Comparative Experiment 1-1, on which in turn was formed cross-shaped collecting electrodes. The sample was checked for its voltage-current characteristics under the dark conditions and found to be ohmic. When checked also for its voltage-current characteristics after the irradiation by a light of AM 1.5 and 100 mW/cm², the sample was found to generate no photovoltaic effect. Moreover, on a glass-made substrate was formed a p-type semiconductor layer used in Experiment 6, on which in turn was formed a first transparent conductive layer in the same manner as Comparative Experiment 1-1. The initial sheet resistance and the sheet resistance after a time lapse of 1000 hours at a temperature of 120° C. were measured and found to be 69.5 Ω/□ and 83.2 Ω/□, respectively.

Comparative Experiment 6-2

Next, the second transparent conductive layer was checked for its single-film characteristics. As in Experiment 6, on a Mo/glass-made substrate was formed a p-type semiconductor layer comprised of $CuInSe_2$, on which in turn was formed a second transparent conductor layer with a film-thickness of 60 nm in the same manner as in Comparative Experiment 1-2, on which in turn was formed cross-shaped collecting electrodes. When its voltage-current characteristic under dark conditions was checked, the sample was found to be rectifying. When its voltage-current characteristic was checked after light irradiation of AM 1.5 and 100 mW/cm², the sample was found to generate minimal photovoltaic effect. Then, on a glass-made substrate was formed a p-type semiconductor layer used in Experiment 6, on which a second transparent conductive layer was formed in the same manner as in Comparative Experiment 1-2. The initial sheet resistance and the sheet resistance after a time lapse of 1000 hours at a temperature of 120° C. were measured and found to be 41.8 Ω/□ and 43.9 Ω/□.

Although p-type microcrystalline silicon (μc-Si:H:B) and polycrystalline $CuInSe_2$ were used as p-type semiconductor layers above, the effects by the present invention are not restricted to the above-mentioned cases and can be obtained as long as semiconductors that have a p-type conductivity are employed.

EXAMPLES

The effects by the present invention are detailed below with reference to examples, but are not restricted to them.

Example 1

A non-monocrystalline silicon-made solar cell was prepared that has p-type microcrystalline silicon as p-type semiconductor layers and one pin junction as photovoltaic layers. As a support structure, a stainless-steel plate (SUS430BA) with a dimension of 50×50×0.15 mm was used, and the DC magnetron sputtering method was used to form reflecting layers comprised of Ag and lower transparent conductive layers comprised of ZnO. These lower transparent conductive layers comprised of ZnO had unevenness in the surface with an average center-line roughness Ra of 0.12 μm. RF plasma-enhanced CVD with a frequency of 13.56 MHz was used to form n-type semiconductor layers comprised of a-Si:H:P, while VHF plasma-enhanced CVD with a frequency of 13.56 MHz was used to form p-type semiconductor layers comprised of μc-Si:H:B. Next, like in Experiment 1, a mask that has 25 openings with a 6-mm diameter was used to form a first transparent conductive layer and a second transparent conductive layer; then a cross-shaped mask was used to form collecting electrodes. The detailed forming conditions are listed in Table 8. Four such solar cells were prepared—1A, 1B, 1C, and 1D.

The solar cell characteristics of those four solar cells were measured under light irradiation of AM 1.5 and 100 mW/cm². The average conversion efficiency of 4×25 subcells was 7.01%.

Next, thermal tests were conducted on the solar cells. Like in Experiment 1, solar cell 1B was placed in a high-temperature environmental testing machine held at a temperature of 120° C. and was measured for its solar cell characteristics after a time lapse of 1000 hours and found to have a conversion efficiency of 6.99%.

Next, light irradiation tests were conducted on the solar cells. The above-mentioned light was continuously applied to a solar cell 1C held at a temperature of 50° C. and was measured for its solar cell characteristics after a time lapse of 1000 hours and found to have a conversion efficiency of 6.93%.

Next, torsion tests were conducted. In a state where it is fixed at its three corners, solar cell 1D was distorted upward by as much as 9.0 mm and then downward by the same displacement, which is 6 times the following displacement set forth in the Solar Cell JIS C8917:

$h = 0.021 \times (0.05^2 + 0.05^2)^{0.5} = 0.0015$ (m)

$= 1.5$ (mm)

This operation was repeated 100 times and then also to the other three corners in the same manner. No changes were to be observed in the outer appearances and the conversion efficiency was found to be 6.97% when the solar cell characteristics were measured. The solar cell characteristics of this solar cell and the others are summarized in Table 9. As can be seen from this table, the photovoltaic element according to the present invention was found to be excellent in all of the initial average characteristics (initial characteristics), average characteristics after thermal test (post-thermal-test characteristics), average characteristics after light irradiation (post-light-irradiation characteristics), and average characteristics after torsion test (post-torsion-test characteristics).

Comparative Example 1-1

Almost the same solar cells as those in Experiment 1 were prepared and similar tests were conducted except that a single layer of the first transparent conductive layer with a thickness of 60 nm was used as a transparent conductive layer like in Comparative Experiment 1-1. The results are summarized in Table 9. The results have shown that as compared to those prepared in Example 1-1 the solar cells of Comparative Example 1-1 are similarly excellent in terms of the initial solar cell characteristics, but inferior in terms of thermal tests, light irradiation tests, and torsion tests. After the torsion tests, no changes were observed in the outer appearances, but short-circuiting was observed at some sub-cells.

Comparative Example 1-2

Almost the same solar cells as in Example 1 were prepared, and similar tests were conducted except that a single layer of the second transparent conductive layer with a film-thickness of 60 nm was used as the transparent conductive layer like in Comparative Experiment 1-2. The results are listed in Table 9. The results have shown that the solar cells used in Comparative Example 1-2 are inferior in terms of the initial solar cell characteristics and in torsion tests. After the torsion tests, no changes were observed in the outer appearances, but short-circuiting was observed at some sub-cells.

As can be seen from the above description, the photovoltaic element according to the present invention was found to be superior to the conventional photovoltaic elements in all of the initial characteristics, post-thermal-test characteristics, post-light-irradiation characteristics, and post-torsion-test characteristics.

Example 2

Figure 15:
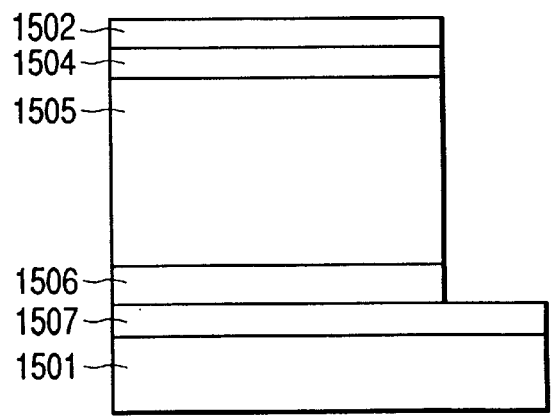
FIG. 15 is a schematic cross-sectional view of another embodiment of a photovoltaic element according to the present invention.

In this example, non-monocrystalline silicon solar cells having a configuration shown in FIG. 15 were prepared that have p-type microcrystalline silicon carbide ($\mu$c-SiC:H:B) as p-type semiconductor layers and one pin junction as photovoltaic layers. A support structure was comprised of glass with a dimension of 100×10×1.0 mm, and like in Example 1, a second transparent conductive layer and a first transparent conductive layer were stacked sequentially except that the second transparent conductive later had a tin oxide content of 15 mole %. Next, on the first transparent conductive layer was formed a p-type semiconductor layer by microwave plasma-enhanced CVD, which is comprised of microcrystalline silicon carbide, on which were also formed an i-type semiconductor layer and an n-type semiconductor layer like in Example 1. Next, the DC magnetron sputtering method was used to sequentially stack a lower transparent conductive layer comprised of ZnO and a reflecting layer comprised of Ag. This lower transparent conductive layer comprised of ZnO had unevenness in its surface and an average center-line roughness Ra of 0.10 ($\mu$m). Four such solar cells were prepared—2A, 2B, 2C, and 2D. The detailed forming conditions are listed in Table 10.

Those four solar cells were measured for their solar cell characteristics under a light irradiation of AM 1.5 and 100 mW/cm$^2$. The average conversion efficiency of these four solar cells was found to be 7.25%.

Next, like in Example 1, thermal tests were conducted on those solar cells, after which the conversion efficiency of solar cell 2B was 7.24%.

Next, light irradiation tests were conducted on those solar cells. After the tests, the conversion efficiency of solar cell 2C was 7.17%.

Next, hailing tests were conducted. Under the conditions with a hail-ball diameter of 25 mm and a final speed of 23 m/sec taken from the Solar Cell JIS C8917, a total of 100 balls struck the glass surface evenly. Then, the solar cell characteristics were measured to find the conversion efficiency to be 7.19%. This item and the other solar cell characteristics are listed in Table 11. As can be seen from this table, the photovoltaic element according to the present invention is superior in all of the initial characteristics, the post-thermal-test characteristics, the post-light-irradiation characteristics, and the post-torsion-test characteristics.

Comparative Example 2-1

Almost the same solar cells as those in Example 2 were prepared, and similar tests were conducted except that a single layer of a first transparent conductive layer with a film-thickness of 60 nm was used as the transparent conductive layer as in Comparative Example 1-1. The results are indicated in Table 11. The results have shown that the solar cells of Comparative Example 2-1 are excellent in the initial solar cell characteristics like those in Example 2, but inferior to them in the thermal test, the light irradiation test, and the hailing test. Also, the surface was observed after the hailing test and found to have small peeling with a diameter of 5 $\mu$m or so at a few positions. The XMA analysis found that those delaminations occurred at the interface between the transparent conductive layer and the p-type semiconductor layer.

Comparative Example 2-2

Almost the same solar cells as those in Example 2 were prepared, and similar tests were conducted except that a single layer of a second transparent conductive layer was used as the transparent conductive layer like in Comparative Example 1-2. The results are indicated in Table 11. The results have shown that the solar cells in Comparative Example 2-2 are inferior in terms of the initial solar cell characteristics and also in the hailing test. Also, the surface was observed after the hailing test to have small delaminations with a diameter of 10 $\mu$m or so at a few positions. The XMA analysis has shown that those delaminations occurred at the interface between the transparent conductive layer and the p-type semiconductor layer.

As can be seen from the above description, the photovoltaic element according to the present invention is superior to the conventional photovoltaic elements in all of the initial characteristics, the post-thermal-test characteristics, the post-light-irradiation-test characteristics, and the post-torsion-test characteristics.

Example 3

In this example, solar cells were prepared that employ transparent conductive layers in which the tin concentration changes linearly in the film-thickness direction. Almost the same solar cells (four) as those in Example 1 were prepared as shown in FIG. 12, except that the transparent conductive layer in Example 1 was made to have such a tin-concentration distribution as shown in FIG. 4. In this example, the target came in indium oxide and tin oxide, and the tin oxide target power was changed as time passed so as to provide $C_{41}=5$ mole % and $C_{42}=10$ mole %. On these solar cells, almost the same measurement and evaluation as Example 1 were conducted. The solar cells in Example 3 are a little superior to those in Example 1 in all of the four characteristics, i.e., open-circuit voltage, short-circuit current, fill factor, and conversion efficiency. Those solar cells were also found to have almost the same change rate in the thermal test, but, in the light irradiation test and the torsion test, to have a better change rate than those in Example 1.

Example 4

In this example, four solar cells were prepared that use transparent conductive layers shown in FIG. 5 in which the tin concentration steeply changes near the p-type semiconductor layer. They were so prepared so as to provide $C_{51}=1$ mole % and $C_{52}=15$ mole % in FIG. 5. Here, as the target, the indium oxide and tin oxide were provided, and argon and oxygen were used as sputtering gases, so that the tin target power was changed as time passed. Almost the same measurement and evaluation as Example 1 were conducted on those solar cells. The solar cells are a little superior to those solar cells in Example 1 in all of the four characteristics, i.e., open-circuit voltage, short-circuit current, fill factor, and conversion efficiency. Also, the change rate in the thermal test, the light irradiation, and the torsion test was found to be better than those in Example 1.

Example 5

In this example, four solar cells were prepared that use a layer configuration shown in FIG. 2. They were so prepared as to provide $C_{21}=3$ mole %, $C_{22}=10$ mole %, and $C_{23}=15$ mole %. Also, the first, second, and third transparent conductive layers had a film thickness of 10 nm, 10 nm, and 40 (nm), respectively. Almost the same measurement and evaluation as Example 1 were conducted on those solar cells. They are a little superior to those in Example 1 in all four characteristics, i.e., open-circuit voltage, short-circuit current, fill factor, and conversion efficiency. Also, they were found to have a better change rate in the thermal test, the light irradiation test, and the torsion test than those in Example 1.

Example 6

In this example, four solar cells were prepared that have a pinpin junction with such a configuration as shown in FIG. 13. As the second i-type semiconductor layer, a-Si:H was used that is formed by RF plasma-enhanced CVD with a frequency of 13.56 MHz. The forming conditions for each layer are indicated in Table 12. Also, almost the same tests as those in Example 1 were conducted to measure the solar cell characteristics. The results are indicated in Table 13. As can be seen from this table, the photovoltaic element according to the present invention is superior to the conventional ones in all of the initial characteristics, the post-thermal-test characteristics, the post-light-irradiation characteristics, and the post-torsion-test characteristics.

Comparative Example 6-1

Almost the same solar cells as those in Example 6 were prepared, and similar tests were conducted, except that a single layer of the first transparent conductive layer was used as the transparent conductive layer as in Comparative Example 1-1. The results are indicated in Table 13. As can be seen from it, the solar cells in Comparative Example 6-1 are excellent like those in Example 6, but inferior to them in the thermal test, the light irradiation test, and the torsion test. After the torsion test, no changes were observed in the outer appearances, but short-circuiting was observed at some sub-cells.

Comparative Example 6-2

Almost the same solar cells as those in Example 6 were prepared, and similar tests were conducted, except that a single layer of the second transparent conductive layer with a diameter of film-thickness of 60 nm was used as the transparent conductive layer as in Comparative Example 1-2. The results are indicated in Table 13. As can be seen from it, the solar cells in Comparative Example 6-2 are inferior in terms of the initial solar cell characteristics and also in the torsion test. After the torsion test, no changes were observed in the outer appearances, but short-circuiting was observed at some sub-cells.

As mentioned above, the photovoltaic element according to the present invention was found to be superior to the conventional photovoltaic elements in all of the initial characteristics, the post-thermal-test characteristics, the post-light-irradiation characteristics, and the post-torsion-test characteristics.

Example 7

In this example, four solar cells using n-type monocrystalline silicon substrates formed by the CZ method were prepared. First, on one side of the n-type monocrystalline silicon substrate, phosphorous ions were implanted under the conditions of 30 keV and $1 \times 10^{15}$ particles/cm$^2$ to form n$^+$-type semiconductor layers. On the other side also, boron ions were implanted under the conditions of 100 keV and $8 \times 10^{15}$ particles/cm$^2$ to form p$^+$-type semiconductor layers. Next, they underwent annealing for 30 minutes at a temperature of 950° C. in an atmosphere of nitrogen. Next, first and second transparent conductive layers having a 6-mm diameter were formed as many as 25 each under the forming conditions indicated in Table 14 to finally form collecting electrodes consisting of cross-shaped Al similar to those in Example 1. On these four solar cells, almost the same tests as those in Example 2 were conducted. The solar cell characteristics are indicated in Table 15. As can be seen from it, the photovoltaic element according to the present invention is superior in all of the initial characteristics, the post-thermal-test characteristics, the post-light-irradiation characteristics, and the post-hailing-test characteristics. After the hailing test, no changes were observed in the outer appearances.

Comparative Example 7-1

Almost the same solar cells as those in Example 7 were prepared, and similar tests were conducted, except that a single layer of a transparent conductive layer with a film-thickness of 70 nm was used as the transparent conductive layer like in Comparative Example 2-1. The results are indicated in Table 15. The results have shown that the solar cells prepared in Comparative Example 7-1 are excellent in the initial solar cell characteristics as in Example 7, but inferior to them in the thermal test, the light irradiation test, and the hailing test. After the hailing test, the surface was observed to have small delaminations having a diameter of 1 μm at a few positions. The XMA analysis has shown that those delaminations occurred at the interface between the transparent conductive layer and the p-type semiconductor layer.

Comparative Example 7-2

Almost the same solar cells as those in Example 7 were prepared, and similar tests were conducted, except that a single layer of a second transparent conductive layer with a film thickness of 70 nm was used as the transparent conductive layer likely in Comparative Example 2-2. The results are indicated in Table 15. The results have shown that the solar cells prepared in Comparative Example 7-2 are inferior in terms of the initial solar cell characteristics and also in the torsion test. Also, after the hailing test, the surface was observed to have small delaminations with a diameter of 10 μm or so at a few positions. The XMA analysis has shown that those delaminations occurred at the interface between the transparent conductive layer and the p-type semiconductor layer.

As mentioned above, the photovoltaic element according to the present invention is superior to the conventional photovoltaic elements in all of the initial characteristics, the post-thermal-test characteristics, the post-light-irradiation characteristics, the post-torsion-test characteristics, and the post-hailing-test characteristics.

According to the present invention, there can be provided a photovoltaic element having a high open circuit voltage, short circuit current and conversion efficiency. Further, it is possible to improve the thermal stability, stability to continuous light irradiation and mechanical strength of a photovoltaic element. In addition, since the resistance of the transparent conductive layer can be made small, it is possible to broaden the distance between the collecting electrodes, so that the module efficiency can be increased.

TABLE 1

(Experiment 1)

Substrate (stainless steel)

| | Forming method | Main component | Dopant | SiH$_4$ (sccm) | H$_2$ (sccm) | BF$_3$ (sccm) | Power (W) | Pressure (Pa) | Temperature (° C.) | Layer thickness (nm) |
|---|---|---|---|---|---|---|---|---|---|---|
| P-type semi-conductor layer | RF plasma CVD | μc-Si:H | B | 1 | 50 | 0.1 | 40 | 200 | 180 | 50 |

| | Forming method | Main component | Dopant | SnO$_2$ concentration of target (mole %) | Ar (sccm) | He (sccm) | Power (W) | Pressure (Pa) | Temperature (° C.) | Layer thickness (nm) |
|---|---|---|---|---|---|---|---|---|---|---|
| first transparent conductive layer | DC magnetron sputtering | In$_2$O$_3$ | SnO$_2$ | 5 | 30 | 0 | 200 | 0.532 | 200 | 10 |
| second transparent conductive layer | DC magnetron sputtering | In$_2$O$_3$ | SnO$_2$ | 10 | 30 | 0 | 200 | 0.532 | 200 | 50 |
| Collecting electrode | DC magnetron sputtering | Al | — | — | 30 | 0 | 500 | 0.532 | 30 | 200 |

Dark state voltage-current characteristics: ohmic
Photovoltaic effect: none
P-type semiconductor layer and first and second transparent conductive layers stacked on glass substrate

| Initial sheet resistance | Sheet resistance after heat resistance test |
|---|---|
| (Ω/□) 48.0 | (Ω/□) 50.8 |

TABLE 2

(Comparative Experiment 1-1)

Substrate (stainless steel)

| | Forming method | Main component | Dopant | SiH$_4$ (sccm) | H$_2$ (sccm) | BF$_3$ (sccm) | Power (W) | Pressure (Pa) | Temperature (° C.) | Layer thickness (nm) |
|---|---|---|---|---|---|---|---|---|---|---|
| P-type semi-conductive layer | RF plasma CVD | μc-Si:H | B | 1 | 50 | 0.1 | 40 | 200 | 180 | 50 |

TABLE 2-continued

| | Forming method | Main component | Dopant | SnO$_2$ concentration of target (mole %) | Ar (sccm) | He (sccm) | Power (W) | Pressure (Pa) | Temperature (° C.) | Layer thickness (nm) |
|---|---|---|---|---|---|---|---|---|---|---|
| first transparent conductive layer | DC magnetron sputtering | In$_2$O$_3$ | SnO$_2$ | 5 | 30 | 0 | 200 | 0.532 | 200 | 60 |
| Collecting electrode | DC magnetron sputtering | Al | — | — | 30 | 0 | 500 | 0.532 | 30 | 200 |

Dark state voltage-current characteristics: ohmic
Photovoltaic effect: none
P-type semiconductor layer and first transparent conductive layer stacked on glass substrate

| Initial sheet resistance | Sheet resistance after heat resistance test | Tin concentration |
|---|---|---|
| (Ω/□) 70.4 | (Ω/□) 85.1 | (mole %) 5.1 |

TABLE 3

(Comparative Experiment 1-2)

Substrate (stainless steel)

| | Forming method | Main component | Dopant | SiH$_4$ (sccm) | H$_2$ (sccm) | BF$_3$ (sccm) | Power (W) | Pressure (Pa) | Temperature (° C.) | Layer thickness (nm) |
|---|---|---|---|---|---|---|---|---|---|---|
| P-type semi-conductive layer | RF plasma CVD | μc-Si:H | B | 1 | 50 | 0.1 | 40 | 200 | 180 | 50 |

| | Forming method | Main component | Dopant | SnO$_2$ concentration of target (mole %) | Ar (sccm) | He (sccm) | Power (W) | Pressure (Pa) | Temperature (° C.) | Layer thickness (nm) |
|---|---|---|---|---|---|---|---|---|---|---|
| second transparent conductive layer | DC magnetron sputtering | In$_2$O$_3$ | SnO$_2$ | 10 | 30 | 0 | 200 | 0.532 | 200 | 60 |
| Collecting electrode | DC magnetron sputtering | Al | — | — | 30 | 0 | 500 | 0.532 | 30 | 200 |

Dark state voltage-current characteristics: some rectifying property
Photovoltaic effect: none
P-type semiconductor layer and second transparent conductive layer stacked on glass substrate

| Initial sheet resistance | Sheet resistance after heat resistance test | Tin concentration |
|---|---|---|
| (Ω/□) 42.1 | (Ω/□) 44.3 | (mole %) 10.3 |

TABLE 4

(Experiment 2)

Substrate (stainless steel)

| | Forming method | Main component | Dopant | SiH$_4$ (sccm) | H$_2$ (sccm) | BF$_3$ (sccm) | Power (W) | Pressure (Pa) | Temperature (° C.) | Layer thickness (nm) |
|---|---|---|---|---|---|---|---|---|---|---|
| P-type semi-conductive layer | RF plasma CVD | μc-Si:H | B | 1 | 50 | 0.1 | 40 | 200 | 180 | 50 |

| | Forming method | Main component | Dopant | Weight ratio of (metal Sn)/ (metal In) | O$_2$ (sccm) | Pressure (mPa) | Temperature (° C.) | Layer thickness (nm) |
|---|---|---|---|---|---|---|---|---|
| first transparent conductive layer | Resistance heating vacuum evaporation | In$_2$O$_3$ | SnO$_2$ | 1 | 30 | 66.5 | 200 | 60 |

TABLE 4-continued

| | Forming method | Main component | Dopant | SnO$_2$ concentration of target (mole %) | Ar (sccm) | He (sccm) | Power (W) | Pressure (Pa) | Temperature (° C.) | Layer thickness (nm) |
|---|---|---|---|---|---|---|---|---|---|---|
| second transparent conductive layer | DC magnetron sputtering | In$_2$O$_3$ | SnO$_2$ | 15 | 30 | 0 | 200 | 0.532 | 200 | 50 |
| Collecting electrode | DC magnetron sputtering | Al | — | — | 30 | 0 | 500 | 0.532 | 30 | 200 |

Dark state voltage-current characteristics: ohmic
Photovoltaic effect: none
P-type semiconductor layer and first and second transparent conductive layers stacked on glass substrate

| Initial sheet resistance | Sheet resistance after heat resistance test |
|---|---|
| (Ω/□) 50.3 | (Ω/□) 52.3 |

TABLE 5

(Comparative Experiment 2-1)

Substrate (stainless steel)

| | Forming method | Main component | Dopant | SiH$_4$ (sccm) | H$_2$ (sccm) | BF$_3$ (sccm) | Power (W) | Pressure (Pa) | Temperature (° C.) | Layer thickness (nm) |
|---|---|---|---|---|---|---|---|---|---|---|
| P-type semi-conductive layer | RF plasma CVD | μc-Si:H | B | 1 | 50 | 0.1 | 40 | 200 | 180 | 50 |

| | Forming method | Main component | Dopant | Weight ratio of (metal Sn)/(metal In) | O$_2$ (sccm) | | Pressure (mPa) | Temperature (° C.) | Layer thickness (nm) |
|---|---|---|---|---|---|---|---|---|---|
| first transparent conductive layer | Resistance heating vacuum evaporation | In$_2$O$_3$ | SnO$_2$ | 1 | 30 | | 0.0665 | 200 | 60 |
| Collecting electrode | DC magnetron sputtering | Al | — | — | 30 | 0 | 500 | 0.532 | 30 | 200 |

Dark state voltage-current characteristics: ohmic
Photovoltaic effect: none
P-type semiconductor layer and first transparent conductive layer stacked on glass substrate

| Initial sheet resistance | Sheet resistance after heat resistance test | Tin concentration |
|---|---|---|
| (Ω/□) 205 | (Ω/□) 730 | (mole %) 0.9 |

TABLE 6

(Comparative Experiment 2-2)

Substrate (stainless steel)

| | Forming method | Main component | Dopant | SiH$_4$ (sccm) | H$_2$ (sccm) | BF$_3$ (sccm) | Power (W) | Pressure (Pa) | Temperature (° C.) | Layer thickness (nm) |
|---|---|---|---|---|---|---|---|---|---|---|
| P-type semi-conductive layer | RF plasma CVD | μc-Si:H | B | 1 | 50 | 0.1 | 40 | 200 | 180 | 50 |

| | Forming method | Main component | Dopant | SnO$_2$ concentration of target (mole %) | Ar (sccm) | He (sccm) | Power (W) | Pressure (Pa) | Temperature (° C.) | Layer thickness (nm) |
|---|---|---|---|---|---|---|---|---|---|---|
| second transparent conductive layer | DC magnetron sputtering | In$_2$O$_3$ | SnO$_2$ | 15 | 30 | 0 | 200 | 0.532 | 200 | 60 |
| Collecting electrode | DC magnetron sputtering | Al | — | — | 30 | 0 | 500 | 0.532 | 30 | 200 |

TABLE 6-continued

Dark state voltage-current characteristics: some rectifying property
Photovoltaic effect: none
P-type semiconductor layer and second transparent conductive layer stacked on glass substrate

| Initial sheet resistance | Sheet resistance after heat resistance test | Tin concentration |
|---|---|---|
| (Ω/□) | (Ω/□) | (mole %) |
| 37.7 | 38.5 | 15.5 |

TABLE 7

(Experiment 3)

| Tin concentration (mole %) | Initial sheet resistance (Ω/□) | Sheet resistance after heat resistance test (Ω/□) | Rate of change |
|---|---|---|---|
| 1.1 | 185 | 320 | 1.73 |
| 2.3 | 105 | 156 | 1.49 |
| 5.1 | 70.4 | 85.1 | 1.21 |
| 8.5 | 56.2 | 61.2 | 1.09 |
| 10.3 | 42.1 | 44.3 | 1.05 |
| 12.1 | 39.5 | 40.6 | 1.03 |
| 15.5 | 37.7 | 38.5 | 1.02 |
| 19.5 | 35.6 | 36.0 | 1.01 |
| 23.5 | 41.1 | 42.0 | 1.02 |
| 26.7 | 53.0 | 54.6 | 1.03 |
| 29.2 | 57.3 | 59.6 | 1.04 |
| 33.2 | 60.2 | 63.2 | 1.05 |

TABLE 8

(Example 1)

Substrate (stainless steel)

| | Forming method | Main component | Dopant | Target | Ar (sccm) | He (sccm) | Power (W) | Pressure (Pa) | Temperature (° C.) | Layer thickness (nm) |
|---|---|---|---|---|---|---|---|---|---|---|
| Reflecting layer | DC magnetron sputtering | Ag | | Ag | 25 | | 400 | 0.665 | 300 | 800 |
| Lower transparent conductive layer | DC magnetron sputtering | ZnO | | ZnO | 25 | | 400 | 0.665 | 300 | 1300 |

| | Forming method | Main component | Dopant | SiH$_4$ (sccm) | H$_2$ (sccm) | BF$_3$ (sccm) | PH$_3$ (sccm) | Power (W) | Pressure (Pa) | Temperature (° C.) | Layer thickness (nm) |
|---|---|---|---|---|---|---|---|---|---|---|---|
| N-type semiconductor layer | RF Plasma CVD | a-Si:H | P | 1 | 50 | | 0.1 | 2 | 172.9 | 200 | 10 |
| I-type semiconductor layer | VHF plasma CVD | μc-Si:H | | 100 | 3000 | | | 160 | 26.6 | 350 | 850 |
| P-type semiconductor layer | RF plasma CVD | μc-Si:H | B | 1 | 50 | 0.1 | | 40 | 200 | 180 | 5 |

| | Forming method | Main component | Dopant | SnO$_2$ concentration of target (mole %) | Ar (sccm) | He (sccm) | Power (W) | Pressure (Pa) | Temperature (° C.) | Layer thickness (nm) |
|---|---|---|---|---|---|---|---|---|---|---|
| first transparent conductive layer | DC magnetron sputtering | In$_2$O$_3$ | SnO$_2$ | 5 | 30 | 0 | 200 | 0.532 | 200 | 10 |

TABLE 8-continued

| | | | | | | | | | | |
|---|---|---|---|---|---|---|---|---|---|---|
| second transparent conductive layer | DC magnetron sputtering | In$_2$O$_3$ | SnO$_2$ | 10 | 30 | 0 | 200 | 0.532 | 200 | 50 |
| Collecting electrode | DC magnetron sputtering | Al | — | — | 30 | 0 | 500 | 0.532 | 30 | 200 |

TABLE 9

| | Initial average characteristics | | | | Average characteristics after thermal test | | | | Average characteristics after light irradiation test | | | |
|---|---|---|---|---|---|---|---|---|---|---|---|---|
| | Open circuit voltage (V) | Short circuit current density (mA/cm$^2$) | Fill factor | Conversion efficiency (%) | Open circuit voltage (V) | Short circuit current density (mA/cm$^2$) | Fill factor | Conversion efficiency (%) | Open circuit voltage (V) | Short circuit current density (mA/cm$^2$) | Fill factor | Conversion efficiency (%) |
| Example 1 | 0.455 | 24.5 | 0.629 | 7.01 | 0.454 | 24.5 | 0.628 | 6.99 | 0.453 | 24.4 | 0.627 | 6.93 |
| Rate after test | | | | | 0.998 | 1.000 | 0.998 | 0.996 | 0.996 | 0.996 | 0.997 | 0.988 |
| Comparative Example 1-1 | 0.455 | 24.6 | 0.625 | 7.00 | 0.454 | 24.4 | 0.586 | 6.49 | 0.451 | 24.4 | 0.596 | 6.56 |
| Rate after test | | | | | 0.998 | 0.992 | 0.938 | 0.928 | 0.991 | 0.992 | 0.954 | 0.938 |
| Comparative Example 1-2 | 0.432 | 23.7 | 0.622 | 6.37 | 0.432 | 23.7 | 0.622 | 6.37 | 0.429 | 23.6 | 0.619 | 6.27 |
| Rate after test | | | | | 1.000 | 1.000 | 1.000 | 1.000 | 0.993 | 0.996 | 0.995 | 0.984 |

| | Average characteristics after torsion test | | | |
|---|---|---|---|---|
| | Open circuit voltage (V) | Short circuit current density (mA/cm$^2$) | Fill factor | Conversion efficiency (%) |
| Example 1 | 0.453 | 24.5 | 0.628 | 6.97 |
| Rate after test | 0.996 | 1.000 | 0.998 | 0.994 |
| Comparative Example 1-1 | 0.442 | 24.3 | 0.576 | 6.19 |
| Rate after test | 0.971 | 0.988 | 0.922 | 0.884 |
| Comparative Example 1-2 | 0.428 | 23.7 | 0.617 | 6.26 |
| Rate after test | 0.991 | 1.000 | 0.992 | 0.983 |

Rate after test = (Characteristics after test)/(Initial characteristics)

TABLE 10

(Example 2)

Substrate (glass)

| | Forming method | Main component | Dopant | SnO$_2$ concentration of target (mole %) | Ar (sccm) | He (sccm) | Power (W) | Pressure (Pa) | Temperature (° C.) | Layer thickness (nm) |
|---|---|---|---|---|---|---|---|---|---|---|
| second transparent conductive layer | DC magnetron sputtering | In$_2$O$_3$ | SnO$_2$ | 15 | 30 | 0 | 200 | 0.532 | 200 | 50 |
| first transparent conductive layer | DC magnetron sputtering | In$_2$O$_3$ | SnO$_2$ | 5 | 30 | 0 | 200 | 0.532 | 200 | 10 |

| | Forming method | Main component | Dopant | SiH$_4$ (sccm) | H$_2$ (sccm) | BF$_3$ (sccm) | PH$_3$ (sccm) | CH$_4$ (sccm) | Power (W) | Pressure (Pa) | Temperature (° C.) | Layer thickness (nm) |
|---|---|---|---|---|---|---|---|---|---|---|---|---|
| P-type semiconductor layer | MW plasma CVD | μc-SiC:H | B | 120 | 50 | 0.1 | | 2.5 | 400 | 1.33 | 350 | 5 |
| I-type semiconductor layer | VHF plasma | μc-Si:H | | 100 | 3000 | | | | 160 | 26.6 | 350 | 850 |
| N-type semiconductor layer | RF plasma | a-Si:H | P | 1 | 50 | | 0.1 | | 2 | 172.9 | 200 | 10 |

TABLE 10-continued (Example 2)

|  | Forming method | Main component | Dopant | Target | Ar (sccm) | Power (W) | Pressure (Pa) | Temperature (° C.) | Layer thickness (nm) |
|---|---|---|---|---|---|---|---|---|---|
| Lower transparent conductive layer | DC magnetron sputtering | ZnO |  | ZnO | 25 | 400 | 0.665 | 300 | 1300 |
| Reflecting layer | DC magnetron sputtering | Ag |  | Ag | 25 | 400 | 0.665 | 30 | 100 |

TABLE 11

|  | Initial average characteristics | | | | Average characteristics after thermal test | | | | Average characteristics after light irradiation test | | | |
|---|---|---|---|---|---|---|---|---|---|---|---|---|
|  | Open circuit voltage (V) | Short circuit current density (mA/cm²) | Fill factor | Conversion efficiency (%) | Open circuit voltage (V) | Short circuit current density (mA/cm²) | Fill factor | Conversion efficiency (%) | Open circuit voltage (V) | Short circuit current density (mA/cm²) | Fill factor | Conversion efficiency (%) |
| Example 2 | 0.468 | 24.8 | 0.625 | 7.25 | 0.467 | 24.8 | 0.625 | 7.24 | 0.467 | 24.6 | 0.625 | 7.17 |
| Rate after test |  |  |  |  | 0.998 | 1.000 | 1.000 | 0.998 | 0.998 | 0.992 | 0.998 | 0.988 |
| Comparative Example 2-1 | 0.467 | 24.9 | 0.623 | 7.24 | 0.465 | 24.7 | 0.589 | 6.76 | 0.465 | 24.8 | 0.572 | 6.60 |
| Rate after test |  |  |  |  | 0.996 | 0.992 | 0.945 | 0.934 | 0.996 | 0.996 | 0.918 | 0.911 |
| Comparative Example 2-2 | 0.452 | 24.1 | 0.620 | 6.75 | 0.451 | 24.0 | 0.619 | 6.70 | 0.450 | 24.0 | 0.619 | 6.69 |
| Rate after test |  |  |  |  | 0.998 | 0.996 | 0.998 | 0.992 | 0.996 | 0.996 | 0.998 | 0.990 |

|  | Average characteristics after torsion test | | | |
|---|---|---|---|---|
|  | Open circuit voltage (V) | Short circuit current density (mA/cm²) | Fill factor | Conversion efficiency (%) |
| Example 2 | 0.466 | 24.7 | 0.625 | 7.19 |
| Rate after test | 0.996 | 0.996 | 1.000 | 0.992 |
| Comparative Example 2-1 | 0.458 | 24.6 | 0.612 | 6.90 |
| Rate after test | 0.981 | 0.988 | 0.982 | 0.952 |
| Comparative Example 2-2 | 0.445 | 24.0 | 0.617 | 6.59 |
| Rate after test | 0.985 | 0.996 | 0.995 | 0.976 |

Rate after test = (Characteristics after test)/(Initial characteristics)

TABLE 12

(Example 6)

Substrate (stainless steel)

|  | Forming method | Main component | Dopant | Target | Ar (sccm) | He (sccm) | Power (W) | Pressure (Pa) | Temperature (° C.) | Layer thickness (nm) |
|---|---|---|---|---|---|---|---|---|---|---|
| Reflecting layer | DC magnetron sputtering | Ag |  | Ag | 25 |  | 400 | 0.665 | 300 | 800 |
| Lower transparent conductive layer | DC magnetron sputtering | ZnO |  | ZnO | 25 |  | 400 | 0.665 | 300 | 1300 |

|  | Forming method | Main component | Dopant | SiH₄ (sccm) | H₂ (sccm) | BF₃ (sccm) | PH₃ (sccm) | Power (W) | Pressure (Pa) | Temperature (° C.) | Layer thickness (nm) |
|---|---|---|---|---|---|---|---|---|---|---|---|
| first n-type semiconductor layer | RF Plasma CVD | a-Si:H | P | 1 | 50 |  | 0.1 | 2 | 172.9 | 200 | 10 |
| first i-type semiconductor layer | VHF plasma CVD | μc-Si:H |  | 100 | 3000 |  |  | 160 | 26.6 | 350 | 850 |

TABLE 12-continued (Example 6)

| | Forming method | Main component | Dopant | SnO$_2$ concentration of target (mole %) | Ar (sccm) | He (sccm) | Power (W) | Pressure (Pa) | Temperature (° C.) | Layer thickness (nm) |
|---|---|---|---|---|---|---|---|---|---|---|
| first p-type semi-conductor layer | RF plasma CVD | μc-Si:H | B | 1 | 50 | 0.1 | 40 | 200 | 180 | 5 |
| second n-type semi-conductor layer | RF plasma CVD | a-Si:H | P | 1 | 50 | 0.1 | 2 | 172.9 | 200 | 10 |
| second i-type semi-conductor type | VHF plasma CVD | a-Si:H | | 2 | 50 | | 2 | 172.9 | 200 | 350 |
| second p-type semi-conductor layer | RF plasma CVD | μc-Si:H | B | 1 | 50 | 0.1 | 40 | 200 | 180 | 5 |

| | Forming method | Main component | Dopant | SnO$_2$ concentration of target (mole %) | Ar (sccm) | He (sccm) | Power (W) | Pressure (Pa) | Temperature (° C.) | Layer thickness (nm) |
|---|---|---|---|---|---|---|---|---|---|---|
| first transparent conductive layer | DC magnetron sputtering | In$_2$O$_3$ | SnO$_2$ | 3 | 30 | 5 | 200 | 0.532 | 180 | 20 |
| second transparent conductive layer | DC magnetron sputtering | In$_2$O$_3$ | SnO$_2$ | 15 | 30 | 5 | 200 | 0.532 | 180 | 40 |
| Collecting electrode | DC magnetron sputtering | Al | — | — | 30 | 0 | 500 | 0.532 | 30 | 200 |

TABLE 13

| | Initial average characteristics | | | | Average characteristics after thermal test | | | | Average characteristics after light irradiation test | | | |
|---|---|---|---|---|---|---|---|---|---|---|---|---|
| | Open circuit voltage (V) | Short circuit current density (mA/cm$^2$) | Fill factor | Conversion efficiency (%) | Open circuit voltage (V) | Short circuit current density (mA/cm$^2$) | Fill factor | Conversion efficiency (%) | Open circuit voltage (V) | Short circuit current density (mA/cm$^2$) | Fill factor | Conversion efficiency (%) |
| Example 6 | 1.396 | 13.0 | 0.712 | 12.9 | 1.396 | 13.0 | 0.711 | 12.9 | 1.382 | 12.9 | 0.674 | 12.0 |
| Rate after test | | | | | 1.000 | 1.000 | 0.999 | 0.999 | 0.990 | 0.992 | 0.947 | 0.930 |
| Comparative Example 6-1 | 1.397 | 13.0 | 0.709 | 12.9 | 1.396 | 12.9 | 0.687 | 12.4 | 1.381 | 12.8 | 0.649 | 11.5 |
| Rate after test | | | | | 0.999 | 0.992 | 0.969 | 0.961 | 0.989 | 0.985 | 0.915 | 0.891 |
| Comparative Example 6-2 | 1.372 | 12.7 | 0.712 | 12.4 | 1.371 | 12.7 | 0.711 | 12.4 | 1.360 | 12.6 | 0.672 | 11.5 |
| Rate after test | | | | | 0.999 | 1.000 | 0.999 | 0.998 | 0.991 | 0.992 | 0.944 | 0.928 |

| | Average characteristics after torsion test | | | |
|---|---|---|---|---|
| | Open circuit voltage (V) | Short circuit current density (mA/cm$^2$) | Fill factor | Conversion efficiency (%) |
| Example 6 | 1.395 | 13.0 | 0.710 | 12.9 |
| Rate after test | 0.999 | 1.000 | 0.997 | 0.996 |
| Comparative Example 6-1 | 1.376 | 12.9 | 0.695 | 12.3 |
| Rate after test | 0.985 | 0.992 | 0.980 | 0.958 |
| Comparative Example 6-2 | 1.361 | 12.7 | 0.692 | 12.0 |
| Rate after test | 0.992 | 1.000 | 0.972 | 0.964 |

Rate after test = (Characteristics after test)/(Initial characteristics)

TABLE 14

(Example 7)

Substrate (stainless steel)

| | Forming method | Main component | Dopant | Temperature (° C.) | Layer Thickness (nm) |
|---|---|---|---|---|---|
| N$^+$-type semi-conductor layer | Ion implantation | CZ-Si | P | 25 | 500 |

TABLE 14-continued (Example 7)

| | | | | | | | | | | |
|---|---|---|---|---|---|---|---|---|---|---|
| N⁻-type semi-conductor layer | | CZ-Si | P | | | | | | | |
| P⁺-type semi-conductor layer | Ion implantation | CZ-Si | B | | | | | | 25 | 300 |
| Annealing treatment | | Heat treatment in $N_2$ atmosphere | | | | | | | 950 | |

| | Forming Method | Main component | Dopant | $SnO_2$ concentration of target (mole %) | Ar (sccm) | He (sccm) | Power (W) | Pressure (Pa) | Temperature (° C.) | Layer Thickness (nm) |
|---|---|---|---|---|---|---|---|---|---|---|
| first transparent conductive layer | DC magnetron sputtering | $In_2O_3$ | $SnO_2$ | 3 | 30 | 10 | 200 | 0.532 | 300 | 20 |
| second transparent conductive layer | DC magnetron sputtering | $In_2O_3$ | $SnO_2$ | 15 | 30 | 10 | 200 | 0.532 | 300 | 50 |
| Collecting electrode | DC magnetron sputtering | Al | — | — | 30 | 0 | 500 | 0.532 | 30 | 200 |

TABLE 15

| | Initial average characteristics | | | | Average characteristics after thermal test | | | | Average characteristics after light irradiation test | | | |
|---|---|---|---|---|---|---|---|---|---|---|---|---|
| | Open circuit voltage (V) | Short circuit current density (mA/cm²) | Fill factor | Conversion efficiency (%) | Open circuit voltage (V) | Short circuit current density (mA/cm²) | Fill factor | Conversion efficiency (%) | Open circuit voltage (V) | Short circuit current density (mA/cm²) | Fill factor | Conversion efficiency (%) |
| Example 7 | 0.604 | 29.2 | 0.771 | 13.6 | 0.604 | 29.2 | 0.771 | 13.6 | 0.604 | 29.2 | 0.771 | 13.6 |
| Rate after test | | | | | 1.000 | 1.000 | 1.000 | 1.000 | 1.000 | 1.000 | 1.000 | 1.000 |
| Comparative Example 7-1 | 0.604 | 29.3 | 0.771 | 13.6 | 0.604 | 29.2 | 0.758 | 13.4 | 0.604 | 29.3 | 0.760 | 13.4 |
| Rate after test | | | | | 1.000 | 0.997 | 0.983 | 0.980 | 1.000 | 1.000 | 0.986 | 0.986 |
| Comparative Example 7-2 | 0.591 | 28.3 | 0.772 | 12.9 | 0.591 | 28.3 | 0.757 | 12.7 | 0.591 | 28.3 | 0.767 | 12.8 |
| Rate after test | | | | | 1.000 | 1.000 | 0.981 | 0.981 | 1.000 | 1.000 | 0.994 | 0.994 |

| | Average characteristics after torsion test | | | |
|---|---|---|---|---|
| | Open circuit voltage (V) | Short circuit current density (mA/cm²) | Fill factor | Conversion efficiency (%) |
| Example 7 | 0.601 | 29.2 | 0.768 | 13.5 |
| Rate after test | 0.995 | 1.000 | 0.996 | 0.991 |
| Comparative Example 7-1 | 0.597 | 29.2 | 0.721 | 12.6 |
| Rate after test | 0.988 | 0.997 | 0.935 | 0.921 |
| Comparative Example 7-2 | 0.581 | 28.3 | 0.754 | 12.4 |
| Rate after test | 0.983 | 1.000 | 0.977 | 0.960 |

Rate after test = (Characteristics after test)/(Initial characteristics)

What is claimed is:

1. A photovoltaic element comprising a p-type semiconductor layer and a transparent conductive layer comprised of indium tin oxide bonded to each other at a surface,
    wherein the transparent conductive layer comprises a plurality of layers including a first layer which is closest to the bonding surface of the p-type semiconductor layer and the transparent conductive layer, and
    wherein a sum of tin oxide content and tin content of the first layer is less than a sum of tin oxide content and tin content of any other of the plurality of layers comprising the transparent conductive layer.

2. The photovoltaic element according to claim 1, wherein the sum of tin oxide content and tin content of the first layer is not more than 10 mole %.

3. The photovoltaic element according to claim 1, wherein a second layer, said second layer being one of the plurality of layers comprising the transparent conductive layer other than the first layer, has a sum of tin oxide content and tin content of not less than 12 mole % and not more than 30 mole %, which is greater than a sum of tin oxide content and tin content of any other of the plurality of layers comprising the transparent conductive layer other than the first layer and the second layer.

4. The photovoltaic element according to claim 1, wherein a thickness of the first layer is not more than half of a thickness of the entire transparent conductive layer.

5. The photovoltaic element according to claim 1, wherein a thickness of a second layer, said second layer being one of the plurality of layers comprising the transparent conductive layer other than the first layer and said second layer having a sum of tin oxide content and tin content greater than a sum of tin oxide content and tin content of any other of the plurality of layers comprising the transparent conductive layer other than the first layer and the second layer, is not less than half of a thickness of the entire transparent conductive layer.

6. The photovoltaic element according to claim 1, wherein the p-type semiconductor layer comprises a portion of a photovoltaic layer having a pn or pin junction.

7. A photovoltaic element comprising a p-type semiconductor layer and a transparent conductive layer comprised of indium tin oxide bonded to each other at a surface,
wherein a sum of tin oxide content and tin content of the transparent conductive layer varies successively in a layer thickness direction and is at a minimum at the bonding surface of the p-type semiconductor layer and the transparent conductive layer.

8. The photovoltaic element according to claim 7, wherein a sum of tin oxide content and tin content of the transparent conductive layer at the bonding surface is not more than 10 mole %.

9. The photovoltaic element according to claim 7, wherein a sum of tin oxide content and tin content is at a maximum in a region of the transparent conductive layer having a sum of tin oxide content and tin content of not less than 12 mole % and not more than 30 mole %.

10. The photovoltaic element according to claim 7, wherein a thickness of a region of the transparent conductive layer having a sum of tin oxide content and tin content of not more than 10 mole % of the transparent conductive layer is not more than half of a thickness of the entire transparent conductive layer.

11. The photovoltaic element according to claim 7, wherein a thickness of a region of the transparent conductive layer having a sum of tin oxide content and tin content of not less than 12 mole % of the transparent conductive layer is not less than half of a thickness of the entire transparent conductive layer.

12. A photovoltaic element comprising a p-type semiconductor layer and a transparent conductive layer comprised of indium tin oxide bonded to each other at a surface in a thermal equilibrium state,
wherein a lower edge energy of the conduction band of the transparent conductive layer varies in a layer thickness direction, and
wherein a difference between the lower edge energy of the conduction band of the transparent conductive layer and a Fermi level in the vicinity of the bonding surface of the p-type semiconductor layer and the transparent conductive layer is larger than an average of a difference therebetween of the entire transparent conductive layer.

13. The photovoltaic element according to claim 12, wherein the p-type semiconductor layer comprises a portion of a photovoltaic layer having a pn or pin junction.

* * * * *

UNITED STATES PATENT AND TRADEMARK OFFICE
CERTIFICATE OF CORRECTION

PATENT NO. : 6,344,608 B2 Page 1 of 1
DATED : February 5, 2002
INVENTOR(S) : Kariya et al.

It is certified that error appears in the above-identified patent and that said Letters Patent is hereby corrected as shown below:

Title page,
Item [56], References Cited, FOREIGN PATENT DOCUMENTS, "JP 8043840 A * 2/1996....G02F/1/1343" should be deleted; and
OTHER PUBLICATIONS, "cone" should read -- con --.

Column 2,
Line 6, "German" should read -- germanium --.

Column 6,
Line 7, "photovoltaic," should read -- photovoltaic element, --.

Column 11,
Line 53, "ITO etc." should read -- ITO, etc. in material. --

Columns 23 and 24,
[TABLE 3], "Photovoltaic effect: none" should read -- Photovoltaic effect: some --.

Columns 29 and 30,
[TABLE 10], under the column "SiH$_4$ (sccm)", "120" should read -- 10 --; and
[TABLE 10], "VHF plasma" should read -- VHF plasma CVD --; and
[TABLE 10], "RF plasma" should read -- RF plasma CVD --.

Columns 31 and 32,
[TABLE 11], under the column "Fill factor", "0.625" should read -- 0.624 --.

Signed and Sealed this

Eleventh Day of February, 2003

JAMES E. ROGAN
*Director of the United States Patent and Trademark Office*